US012724090B2

(12) United States Patent
Houda et al.

(10) Patent No.: US 12,724,090 B2
(45) Date of Patent: Sep. 1, 2026

(54) ELECTRICITY GENERATING SENSOR

(71) Applicants: ORIENTAL MOTOR CO., LTD., Tokyo (JP); Sakao Ozeki, Kakegawa (JP)

(72) Inventors: Akihiko Houda, Tsukuba (JP); Masayuki Someya, Tsukuba (JP); Sakao Ozeki, Kakegawa (JP)

(73) Assignees: ORIENTAL MOTOR CO., LTD., Tokyo (JP); Sakao Ozeki, Kakegawa (JP)

( * ) Notice: Subject to any disclaimer, the term of this patent is extended or adjusted under 35 U.S.C. 154(b) by 153 days.

(21) Appl. No.: 18/839,153

(22) PCT Filed: May 12, 2022

(86) PCT No.: PCT/JP2022/020118
§ 371 (c)(1),
(2) Date: Aug. 16, 2024

(87) PCT Pub. No.: WO2023/157328
PCT Pub. Date: Aug. 24, 2023

(65) Prior Publication Data

US 2025/0155523 A1 May 15, 2025

(30) Foreign Application Priority Data

Feb. 16, 2022 (JP) ................................ 2022-022293

(51) Int. Cl.
*G01R 33/00* (2006.01)
*G01D 5/20* (2006.01)

(52) U.S. Cl.
CPC ........... *G01R 33/0011* (2013.01); *G01D 5/20* (2013.01)

(58) Field of Classification Search
None
See application file for complete search history.

(56) References Cited

U.S. PATENT DOCUMENTS 4,484,090 A * 11/1984 Wiegand ............... G01P 3/4815 307/419
4,743,780 A * 5/1988 Opie ........................ H03K 3/45 307/106

(Continued)

FOREIGN PATENT DOCUMENTS

EP 0916953 A1 5/1999
EP 3588101 A1 1/2020

(Continued)

OTHER PUBLICATIONS

International Preliminary Report on Patentability (Form PCT/IB/326) dated Aug. 29, 2024, and the English translation (Form PCT/IB/338) dated Jun. 14, 2022, issued by the International Bureau.

(Continued)

*Primary Examiner* — Richard Isla
(74) *Attorney, Agent, or Firm* — Rabin & Berdo, P.C.

(57) ABSTRACT

A power generation sensor includes a magnetic wire configured to exhibit a large Barkhausen effect, a coil wound around the magnetic wire, and a pair of magnetic flux conducting pieces that include a pair of magnetically-soft components respectively magnetically coupled to the opposite end portions of the magnetic wire. The pair of magnetic flux conducting pieces include a pair of axis-orthogonal portions respectively fixed to the opposite end portions of the magnetic wire and respectively extending parallel to each other orthogonally to the axial direction from the opposite end portions of the magnetic wire, and a pair of axis-parallel portions extending toward each other in the axial direction from the distal ends of the axis-orthogonal portions with their adjacent ends opposed to each other and spaced a gap from each other in the axial direction.

7 Claims, 14 Drawing Sheets

(56) References Cited

U.S. PATENT DOCUMENTS

| | | | | |
|---|---|---|---|---|
| 4,758,742 | A * | 7/1988 | Opie | H03K 17/97 307/106 |
| 6,140,727 | A | 10/2000 | Goto et al. | |
| 2019/0148043 | A1 | 5/2019 | Theil et al. | |
| 2019/0386554 | A1 | 12/2019 | Villaret et al. | |
| 2021/0109122 | A1 | 4/2021 | Mitsuhashi | |
| 2023/0068474 | A1* | 3/2023 | Nakamura | G01B 7/30 |
| 2025/0357827 | A1* | 11/2025 | Muranishi | G01D 5/20 |
| 2025/0389553 | A1* | 12/2025 | Houda | G01B 7/003 |
| 2026/0009633 | A1* | 1/2026 | Houda | G01B 7/30 |
| 2026/0009657 | A1* | 1/2026 | Houda | G01D 5/20 |

FOREIGN PATENT DOCUMENTS

| | | | |
|---|---|---|---|
| JP | S54-149456 | A | 11/1979 |
| JP | S55-014511 | U | 1/1980 |
| JP | S6097717 | A | 5/1985 |
| JP | S63-263817 | A | 10/1988 |
| JP | 2598453 | B2 | 4/1997 |
| JP | 2000161989 | A | 6/2000 |
| JP | 3602235 | B2 | 12/2004 |
| JP | 2006-073974 | A | 3/2006 |
| JP | 2009180596 | A | 8/2009 |
| JP | 2016-144335 | A | 8/2016 |
| JP | 6407284 | B2 | 10/2018 |
| JP | 2019-200100 | A | 11/2019 |
| JP | 6647478 | B1 | 2/2020 |
| JP | 6959588 | B2 | 11/2021 |
| WO | 2021/200361 | A1 | 10/2021 |

OTHER PUBLICATIONS

Extended European Search Report issued for corresponding European patent application No. 22927226.5 dated Mar. 13, 2026.

* cited by examiner 280
110
113
411
410a
N
S
410
z
x 300
330
110
113
411
331
D, L
410a
N
S
410
z
x 100
130
110
113
411
D
L
131
410a
N
S
410
z
x 100
130
131
134
134
134b
134b
110
X
410

300
330
331
110
X
410

280
110
X
410

300
411
331
X
g
330
N
410a
S
410

100
411
131
X
130
N
410a
S
410

200
210
221y
220y
221x
220x
231
230
131y
120
130x
131x
130y
133
131
130a
120a
134a
111
(110)
134b
133
134
241
131c
130
134
134a
240
130c
134b
z
y
x 200
133a
133a
130y
130x
111(110)
133
130a
130
130c
z
y
240
120a
134b

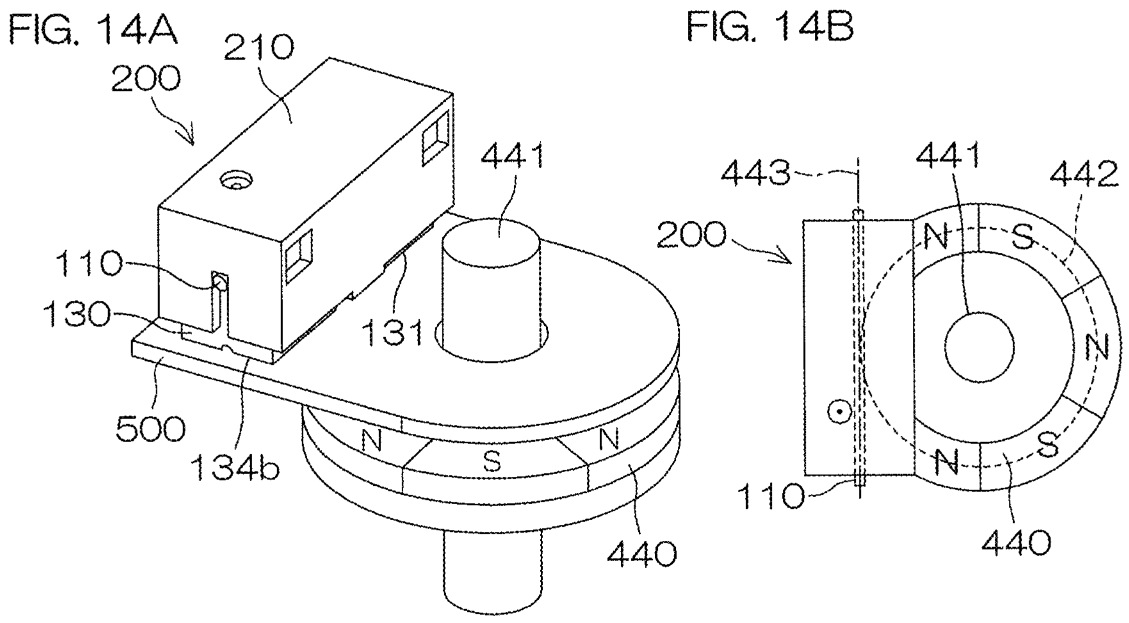
FIG. 14A
210
200
441
110
130
131
500
134b
N
S
N
440
FIG. 14B
443
441
442
200
N
S
N
N
S
110
440
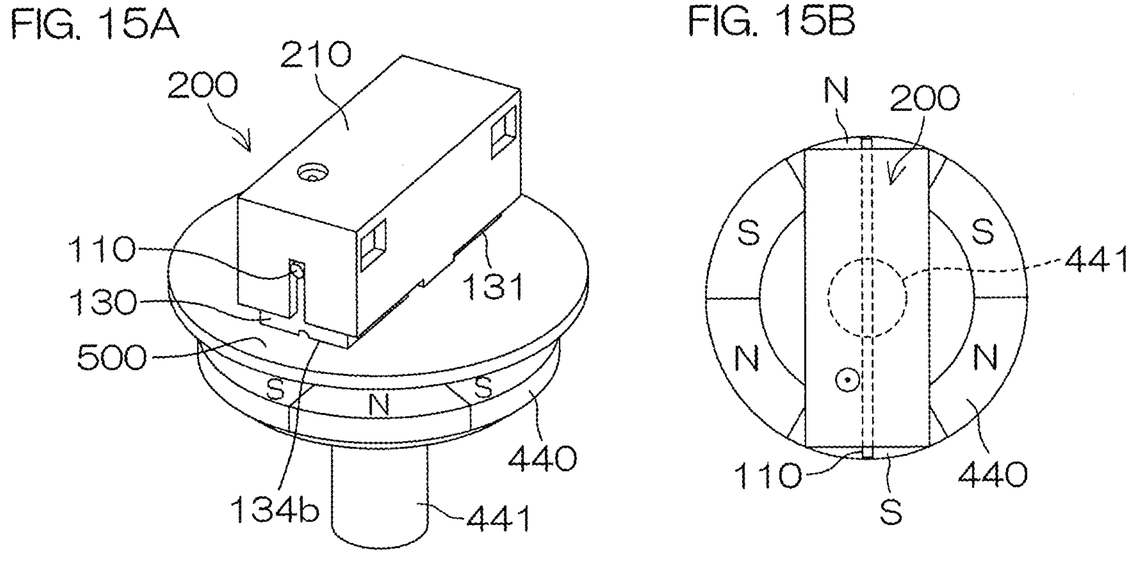
FIG. 15A
210
200
110
130
131
500
S
N
S
440
134b
441
FIG. 15B
N
200
S
S
441
N
N
110
440
S

ELECTRICITY GENERATING SENSOR

RELATED APPLICATION

This application claims the benefit of priority to Japanese Patent Application No. 2022-022293, filed on Feb. 16, 2022, the disclosure of which is entirely incorporated herein by reference.

TECHNICAL FIELD

The present invention relates to a power generation sensor that generates electric power in response to a change in magnetic field.

BACKGROUND ART

Magnetic wires having a large Barkhausen effect (large Barkhausen jump) are known in the name of Wiegand wire or pulse wire. Such a magnetic wire includes a core portion, and a shell portion provided around the core portion. One of the core portion and the shell portion is a soft (magnetically soft) layer in which its magnetization direction is reversed even by application of a weak magnetic field, and the other of the core portion and the shell portion is a hard (magnetically hard) layer in which its magnetization direction is reversed only by application of a strong magnetic field. A power generation sensor is produced by winding a coil around the magnetic wire.

When the hard layer and the soft layer are magnetized in the same direction axially of the wire and the strength of an external magnetic field applied in a direction opposite to that magnetization direction is increased to a certain magnetic field strength, the magnetization direction of the soft layer is reversed. The reversal of the magnetization direction starts at a certain position of the magnetic wire to propagate to the entire wire, whereby the magnetization direction of the soft layer is totally reversed. At this time, the large Barkhausen effect is exhibited to induce a pulse signal in the coil wound around the magnetic wire. When the external magnetic field strength is further increased to another certain magnetic field strength, the magnetization direction of the hard layer is reversed.

The magnetic field strength at which the magnetization direction of the soft layer is reversed is herein referred to as "operational magnetic field" and the magnetic field strength at which the magnetization direction of the hard layer is reversed is herein referred to as "stabilization magnetic field."

A voltage outputted from the coil is characteristically constant irrespective of the change rate of an input magnetic field (external magnetic field), and is free from chattering because of the hysteresis with respect to the input magnetic field. For this reason, the pulse signal outputted from the coil is used for a position detection device and the like. Since the output from the coil involves electric power, a sensor of power generation type (power generation sensor) that does not require the supply of external electric power can be provided.

In order to provide the large Barkhausen effect, it is necessary to reverse the magnetization direction of only the soft layer in a state such that the magnetization directions of the hard layer and the soft layer are consistent. Even if the magnetization direction of only the soft layer is reversed in a state such that the magnetization directions of the hard layer and the soft layer are inconsistent, no pulse signal is generated or a pulse signal having a very small amplitude is generated.

In order to maximize the available electric power, it is important that the reversal of the magnetization direction of the soft layer propagates to the entire magnetic wire from a state such that the magnetization direction of the magnetic wire is entirely consistent. If the magnetization direction of the magnetic wire is partly inconsistent, a pulse signal having a very small amplitude is generated. Therefore, it is preferred to apply a uniform magnetic field to the entire magnetic wire.

PTL 1 to PTL 5 disclose arts related to the power generation sensor and/or the position detection device utilizing a power generation sensor.

PTL 1 discloses a magnetic sensor including cylindrical magnetically-soft magnets provided at the opposite ends of a magnetic wire. PTL 1 states that this arrangement suppresses a demagnetization field generated in the magnetic wire to thereby stabilize a pulse signal output. However, the magnetic wire cannot fully exhibit its intrinsic large Barkhausen effect, unless a magnetic field source is constructed so as to apply a magnetic field parallel to the axial direction of the magnetic wire to the entire magnetic wire.

PTL 2 discloses a power generation element including magnetically-soft members provided at the opposite ends of a magnetic wire in contact with the magnetic wire to press the magnetic wire. PTL 2 states that this arrangement suppresses a demagnetization field generated in the magnetic wire to stabilize a pulse signal output. However, the structure of the magnetically-soft members disclosed in PTL 2 is less effective in guiding and/or shielding a magnetic field leaking from a magnet that generates an external magnetic field. For this reason, a magnetic field parallel to the axial direction of the magnetic wire is not applied to the entire magnetic wire. Therefore, the magnetic wire fails to fully exhibit its intrinsic large Barkhausen effect, making it impossible to expect a high power output.

PTL 3 to PTL 5 disclose arts in which a magnetic field leaking from a detection medium magnet can be guided and/or shielded and a magnetic field parallel to the axial direction of a magnetic wire can be applied to the entire axis of the magnetic wire in order to provide a high power output.

PTL 3 discloses a rotational counter including a magnet attached to a rotary member that rotates about a rotation shaft, and a power generation element. The power generation element has a structure including ferrite beads provided at the opposite ends of a magnetic wire, and a coil wound around the magnetic wire between the ferrite beads. The magnet has a plurality of magnetic poles arranged in a rotation direction, and the magnetic poles each have a first region and a second region which are different in magnetic force strength. The magnet and the power generation element are opposed to each other parallel to the rotation shaft in a region offset from the rotation shaft. PTL 3 states that the ferrite beads attract a magnetic flux directed from the magnet toward the magnetic wire to cause the magnetic flux to act on the magnetic wire therethrough. In order to achieve this action, it is necessary to carefully design the shape of the magnet and a distance (air gap) between the magnet and the power generation element so that a magnetic field having a proper magnetic strength according to the rotation angle of the rotation shaft can be applied to the magnetic wire. This makes it difficult to properly design the layout of the power generation sensor, thereby reducing the design flexibility of the shape of the magnet.

PTL 4 discloses a rotation detection device including magnetic field detection units each including a magnetic wire and a coil wound round the magnetic wire. Four permanent magnets are fixed to the outer periphery of a shaft rotatably supported by a housing, and three magnetic field detection units are disposed outside a circular rotation track of the permanent magnets. The three magnetic field detection units each have an axis extending parallel to the tangential line of the circular rotation track, and can be each opposed to any of the permanent magnets radially of the circular rotation track. The magnetic field detection units are fixed to a substrate, which is fixed to the housing. Further, first magnetic members and second magnetic members are fixed to the substrate. The first magnetic members are each disposed apart from the corresponding magnetic field detection units to cover one of axially opposite end portions of the magnetic field detection unit opposed to the permanent magnet. The second magnetic members are each disposed apart from the corresponding magnetic field detection unit to cover the other axial end of the magnetic field detection unit opposed to the permanent magnet. PTL 4 states that these magnetic members can guide magnetic fields respectively applied to the magnetic field detection units by the permanent magnets to form predetermined magnetic paths.

In a structure shown in FIG. 1 of PTL 4, a pair of magnetic members are disposed in spaced relation from the opposite ends of the corresponding magnetic wire and, therefore, the guiding efficiency is not so high with weak magnetic coupling.

In a structure shown in FIG. 4 of PTL 4, the magnetic members each have an increased area to be opposed to the corresponding magnetic field detection unit with side plates added thereto, thereby improving the guiding efficiency. However, the side plates are disposed apart from the opposite ends of the magnetic wire and, therefore, are less effective. Accordingly, additional side plates are required, which are opposed to the magnetic field detection unit from sides opposite from the permanent magnets. As shown in FIGS. 3A and 5 of PTL 4, the magnetic fields are curved, and magnetic fluxes go in and out of the intermediate portions of the magnetic wires. Therefore, the magnetic field strengths of the entire magnetic wires are not uniform. Further, the magnetic members shown in PTL 4 are less versatile, because the magnetic members should be configured according to the shapes and the layout of the permanent magnets.

PTL 5 discloses an electric signal generation unit configured so that magnetic fields generated by magnets are guided by a first magnetic member and a third magnetic member respectively having elongated notches which accommodate the opposite end portions of a magnetosensitive member of a magnetosensitive wire. The opposite end portions of the magnetosensitive member are directly provided in the notches of the first magnetic member and the third magnetic member, thereby improving the guiding efficiency. However, the first magnetic member and the third magnetic member are not configured to shield magnetic fields leaking from the magnets to the axially middle portion of the magnetosensitive member. Therefore, the magnets should be covered with side yokes provided as a second magnetic member. This increases the number of components and the size of the structure of the electric signal generation unit. Further, the end portions of the first magnetic member and the third magnetic member are inclined inward or outward, so that the first magnetic member and the third magnetic member should be each designed as having an inclination angle and a length according to the shapes and the layout of the magnets. Therefore, the first magnetic member and the third magnetic member are less versatile. Further, it is necessary to accommodate the opposite end portions of the magnetosensitive member in the notches of the first magnetic member and the third magnetic member when the unit is assembled and adjusted. That is, the electric signal generation unit is assembled by placing the opposite end portions of the magnetosensitive member in the notches of the first magnetic member and the third magnetic member while adjusting the positions of the notches (on a workmanship basis). Thus, the assembling of the electric signal generation unit is complicated, and the product performance depends upon the assembling accuracy.

CITATION LIST

Patent Literature

PTL 1: JP2006-73974A
PTL 2: WO2021/200361A1
PTL 3: JP6647478
PTL 4: JP6407284
PTL 5: JP6959588

SUMMARY OF INVENTION

Problems to be Solved by Invention

In order to thus apply a uniform-strength magnetic field axially parallel to the entire magnetic wire, the simple positioning of the power generation sensor alone is not enough, but it is necessary to provide various magnetic members designed according to the overall structure of the detection device between the power generation sensor and the magnets. Specifically, there is a need for magnetic members that are shaped and arranged according to the structures and/or the layout of the detection medium magnets. Therefore, the prior art structures generally suffer from lack of versatility.

In view of the foregoing, one preferred embodiment of the present invention provides a power generation sensor having a structure that ensures improved versatility.

More specifically, the preferred embodiment of the present invention provides a power generation sensor that can be easily combined with various magnetic field sources (typically, magnets) having different shapes and/or different pole numbers and is capable of providing a high power output signal.

Solution to Problems

One preferred embodiment of the present invention provides a power generation sensor, which includes: a magnetic wire configured to exhibit a large Barkhausen effect by an alternating magnetic field applied in an axial direction thereof; a coil wound around the magnetic wire; and a pair of magnetic flux conducting pieces that include a pair of magnetically-soft components respectively magnetically coupled to the opposite end portions of the magnetic wire and are symmetrical with each other with respect to a symmetry plane defined at the axially middle position of the magnetic wire. The pair of magnetic flux conducting pieces include: a pair of axis-orthogonal portions respectively fixed to the opposite end portions of the magnetic wire and respectively extending parallel to each other orthogonally to the axial direction from the opposite end portions of the magnetic wire; and a pair of axis-parallel portions extending toward each other in the axial direction from the distal ends of the axis-orthogonal portions with their adjacent ends opposed to each other and spaced a gap from each other in the axial direction. The distance of the gap between the adjacent ends as measured in the axial direction is 5% to 50% of a distance between the magnetic wire coupling positions of the axis-orthogonal portions as measured in the axial direction. The power generation sensor is configured to have a detection region located on a side of the axis-parallel portions opposite from the magnetic wire.

With this arrangement, a magnetic field occurring in the detection region is guided to the opposite end portions of the magnetic wire by the magnetic flux conducting pieces of the magnetically-soft components. In addition, the axis-parallel portions extending parallel to the axial direction of the magnetic wire are located between the detection region and the magnetic wire, so that a magnetic flux directed from the detection region toward the axially intermediate portion of the magnetic wire is shielded by the axis-parallel portions. In particular, the distance between the adjacent ends of the axis-parallel portions of the magnetic flux conducting pieces as measured in the axial direction is 5% to 50% of the distance between the magnetic wire coupling positions of the axis-orthogonal portions. This provides an excellent magnetic shielding effect. The magnetic field can be applied in the axial direction over a wider axial range of the magnetic wire. Thus, the large Barkhausen effect can be sufficiently exhibited, so that the power generation sensor is capable of providing a high power output signal.

In addition, the power generation sensor includes the magnetic flux conducting pieces, which are fixed and coupled to the magnetic wire. Therefore, it is merely necessary to place a magnetic field source (typically, a magnet) as a detection medium in the detection region. Accordingly, the power generation sensor can be easily combined with various magnetic field sources having different shapes and/or different poles, and a device (e.g., a position detection device) utilizing such a combination can be easily designed.

In a preferred embodiment, the pair of magnetic flux conducting pieces are configured such that a magnetic field generated in a space containing the pair of magnetic flux conducting pieces by a magnetic field source provided in the detection region is corrected into an axial magnetic field extending in the axial direction, and the axial magnetic field is applied to the magnetic wire. With this arrangement, the magnetic flux conducting pieces have a magnetic field correcting function to correct the magnetic field generated by the magnetic field source provided in the detection region, making it possible to apply the axial magnetic field between the opposite end portions of the magnetic wire. Thus, the large Barkhausen effect can be sufficiently exhibited, so that the power generation sensor is capable of generating a high power output pulse signal.

In a preferred embodiment, the distance of the gap as measured in the axial direction is 20% to 40% of the distance between the magnetic wire coupling positions of the pair of axis-orthogonal portions as measured in the axial direction. With this arrangement, the magnetic wire can exhibit its intrinsic large Barkhausen effect almost perfectly, so that the power generation sensor is capable of providing a higher power output.

In a preferred embodiment, the axis-orthogonal portions of the magnetic flux conducting pieces respectively have wire placement portions each formed with a hole or a groove extending therethrough in the axial direction, and the magnetic wire extends through the wire placement portions of the axis-orthogonal portions and is fixed to the axis-orthogonal portions.

With this arrangement, the magnetic wire extends through the axis-orthogonal portions, whereby the opposite end portions of the magnetic wire can be reliably magnetically coupled to the magnetic flux conducting pieces and can be reliably fixed to the magnetic flux conducting pieces.

The axis-orthogonal portions may be each configured in a size, for example, that is substantially the same as the diameter of the coil. In this case, the axis-parallel portions are located between the magnetic wire and the detection region, so that the wire placement portions are offset away from the detection region when the magnetic flux conducting pieces are seen in the axial direction of the magnetic wire. This arrangement is advantageous in that the size of the power generation sensor can be reduced.

In a preferred embodiment, the axis-orthogonal portions each have a thickness that is 10% to 20% of the overall length of the magnetic wire as measured in the axial direction at the magnetic wire coupling position thereof. This arrangement prevents the magnetic paths of the axis-orthogonal portions from being excessively narrowed, thereby avoiding a substantial reduction in large Barkhausen effect pickup efficiency, which may otherwise occur due to the presence of the axis-orthogonal portions. Thus, the power generation sensor is capable of generating a high power output pulse signal.

In a preferred embodiment, the magnetically-soft components are each formed of a material having a coercivity not higher than that of the magnetic wire and a relative magnetic permeability of not lower than 500. This material has characteristic properties such as lower magnetic resistance, smaller hysteresis and lower self-dielectric property. Thus, even if a high-frequency alternating magnetic field generated when the magnetic field source is moved at a higher speed is applied, the output characteristics of the power generation sensor are not significantly influenced. Specifically, the magnetically-soft components are preferably formed of a Ni-ferrite material or a Mn-ferrite material.

In a preferred embodiment, the power generation sensor further includes surface-mounting external terminal electrodes respectively provided on the axis-parallel portions of the magnetic flux conducting pieces as facing the detection region. This arrangement can reduce the number of components of the power generation sensor. Thus, the power generation sensor is of surface-mounting type having a simple and smaller-size structure.

The above and other objects, features and advantages of the present invention will become more apparent from the following description of the preferred embodiments with reference to the attached drawings.

BRIEF DESCRIPTION OF DRAWINGS

FIGS. 14A and 14B are a perspective view and a plan view, respectively, showing a first exemplary arrangement of a rotation detection device employing the power generation sensor according to the second preferred embodiment.

FIGS. 15A and 15B are a perspective view and a plan view, respectively, showing a second exemplary arrangement of the rotation detection device employing the power generation sensor according to the second preferred embodiment.

FIGS. 16A and 16B are a perspective view and a plan view, respectively, showing a third exemplary arrangement of the rotation detection device employing the power generation sensor according to the second preferred embodiment.

DESCRIPTION OF PREFERRED EMBODIMENTS

Figure 1A:
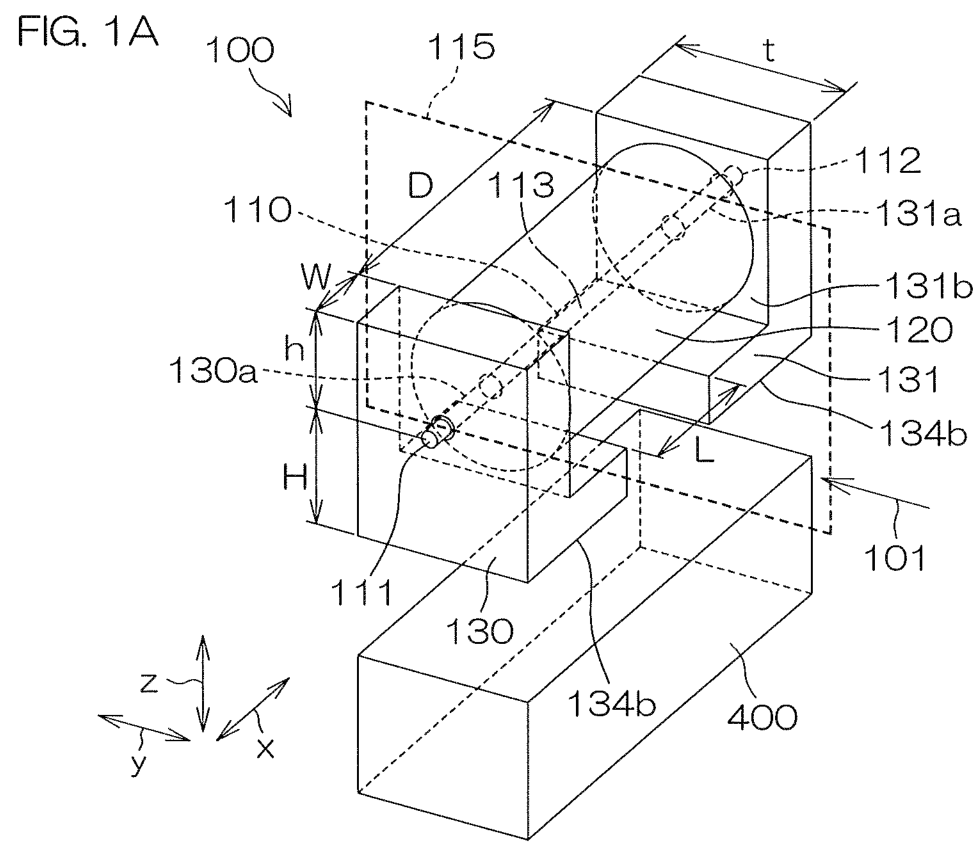
FIG. 1A is a perspective view of a power generation sensor according to a first preferred embodiment.

The present invention will hereinafter be described based on the preferred embodiments shown in the drawings. However, it should be understood that the invention be not limited by the following preferred embodiments.

First Preferred Embodiment

Figure 1B:
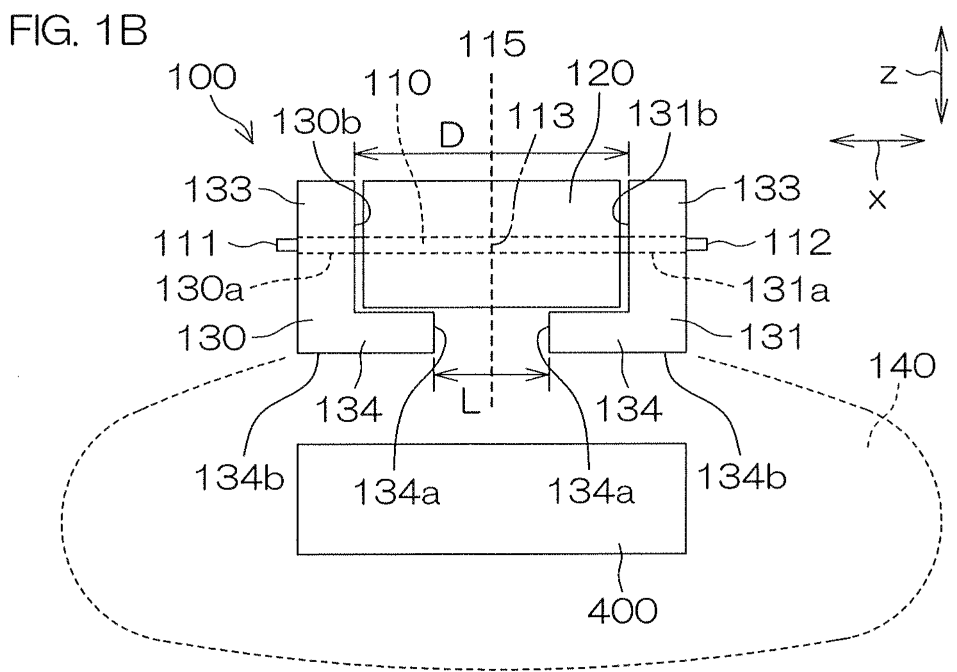
FIG. 1B is a front view as seen in an arrow direction 101 in FIG. 1A.

In FIGS. 1A and 1B, a power generation sensor 100 according to a first preferred embodiment is shown. FIG. 1A is a perspective view of the power generation sensor 100, and FIG. 1B is a front view as seen in an arrow direction 101 in FIG. 1A.

The power generation sensor 100 includes a magnetic wire 110 that is configured to exhibit a large Barkhausen effect, a coil 120 wound around the magnetic wire 110, and a pair of magnetic flux conducting pieces 130, 131 of magnetically-soft components. The coil 120 is wound around the magnetic wire 110 so that a first end portion 111 and a second end portion 112 of the magnetic wire 110 having the same length are exposed from the coil 120. In this preferred embodiment, the coil 120 is wound around the magnetic wire 110 between the pair of magnetic flux conducting pieces 130, 131. The pair of magnetic flux conducting pieces 130, 131 are respectively magnetically coupled to the first end portion 111 and the second end portion 112 of the magnetic wire 110.

The pair of magnetic flux conducting pieces 130, 131 are configured to have substantially the same shape and substantially the same size. More specifically, the pair of magnetic flux conducting pieces 130, 131 are configured to be symmetrical with each other with respect to a symmetry plane 115 (a virtual plane to be used to describe the geometric layout) which extends orthogonally to the axial direction x (length direction, longitudinal direction) of the magnetic wire 110 through the middle position (hereinafter referred to as "axially middle position") 113 of the magnetic wire 110 with respect to the axial direction x. The pair of magnetic flux conducting pieces 130, 131 include axis-orthogonal portions 133 extending parallel to each other from the opposite end portions 111, 112 of the magnetic wire 110 in an orthogonal direction z orthogonal to the axial direction x, and axis-parallel portions 134 extending toward each other from the distal ends of the axis-orthogonal portions 133 in the axial direction x.

The opposite end portions 111, 112 of the magnetic wire 110 are respectively fixed to the proximal portions of the axis-orthogonal portions 133 of the pair of magnetic flux conducting pieces 130, 131. More specifically, the axis-orthogonal portions 133 respectively include wire placement portions 130*a*, 131*a* each provided in the proximal portion thereof in the form of hole or groove extending therethrough in the axial direction x. In FIG. 1A and the like, the wire placement portions 130*a*, 131*a* are each illustrated as a hole. Where the wire placement portions 130*a*, 131*a* are each provided in the form of groove, the groove preferably extends in the orthogonal direction z to open in an end surface opposite from a detection region 140 to be described later. The first end portion 111 and the second end portion 112 of the magnetic wire 110 respectively extend through the wire placement portions 130*a*, 131*a* of the axis-orthogonal portions 133 and, in this state, are respectively fixed to the axis-orthogonal portions 133. More specifically, a resin (not shown) is provided in the holes or the grooves of the wire placement portions 130*a*, 131*a*, whereby the opposite end portions 111, 112 of the magnetic wire 110 are respectively fixed to and combined with the axis-orthogonal portions 133. Thus, the magnetic wire 110 is mechanically fixed to and magnetically coupled to the pair of magnetic flux conducting pieces 130, 131.

The axis-parallel portions 134 of the pair of magnetic flux conducting pieces 130, 131 are disposed on opposite sides of the symmetry plane 115 extending through the axially middle position 113 of the magnetic wire 110 with their adjacent ends 134*a* opposed to each other. That is, the adjacent ends 134*a* of the axis-parallel portions 134 are opposed to and spaced a gap from each other in the axial direction x. The middle position of the gap between the adjacent ends 134*a* in the axial direction x corresponds to the axially middle position 113 defined with respect to the axial direction x. Therefore, the adjacent ends 134*a* of the pair of axis-parallel portions 134 are spaced the same distance from the symmetry plane 115 as measured in the axial direction x. The distance L of the gap as measured in the axial direction x is 5% to 50%, preferably 20% to 40%, of a distance D between magnetic wire coupling positions of the pair of axis-orthogonal portions 133 at which the magnetic wire 110 is coupled to the respective axis-orthogonal portions 133. More specifically, the distance D is a distance between the inner side surfaces 130*b*, 131*b* of the pair of magnetic flux conducting pieces 130, 131 (the inner side surfaces of the axis-orthogonal portions 133) opposed to each other in the axial direction x at the magnetic wire coupling positions as measured in the axial direction x.

The power generation sensor 100 is configured such that a region located on a side of the axis-parallel portions 134 opposite from the magnetic wire 110 serves as the detection region 140. A magnetic field source 400 that generates a magnetic field to be detected is placed in the detection region 140. Typically, the magnetic field source 400 is moved relative to the power generation sensor 100 to pass through the detection region 140. That is, the detection region 140 is located on the movement path of the magnetic field source 400. The pair of magnetic flux conducting pieces 130, 131 are configured such that a magnetic field generated in a space containing the magnetic flux conducting pieces 130, 131 by the magnetic field source 400 placed in the detection region 140 is corrected into an axial magnetic field extending in the axial direction x and the axial magnetic field is applied to the magnetic wire 110.

More specifically, the magnetic flux conducting pieces 130, 131 of the magnetically-soft components each include a generally rectangular parallelepiped-shaped axis-orthogonal portion 133, and a generally rectangular parallelepiped-shaped axis-parallel portion 134 extending from an end of the axis-orthogonal portion 133 opposed to the magnetic field source 400 (i.e., the distal end of the axis-orthogonal portion 133 on the side of the detection region 140), and each have an L-shape bent at right angle at a connection portion between the axis-orthogonal portion 133 and the axis-parallel portion 134. The axis-parallel portions 134 of the magnetic flux conducting pieces 130, 131 extend in the axial direction x so as to cover the magnetic wire 110, i.e., to shield a space between the magnetic wire 110 and the detection region 140. The axis-parallel portions 134 of the pair of magnetic flux conducting pieces 130, 131 having symmetrical shapes extend toward the axially middle side of the magnetic wire 110 with their adjacent ends 134*a* opposed to and spaced a gap from each other near the axially middle position 113 of the magnetic wire 110. The adjacent ends 134*a* respectively have surfaces orthogonal to the axial direction x. Two surfaces of the two adjacent ends 134*a* are parallel to each other and are opposed to each other in the axial direction x. The distance L of the gap between the two adjacent ends 134*a* as measured in the direction x is a distance between the two surfaces of the two adjacent ends 134*a*.

The magnetic flux conducting pieces 130, 131 of the magnetically-soft components and the coil 120 are fixed to a case (not shown) covering these components with the use of an adhesive resin, by fitting, or by other proper fixing means. As described above, the opposite end portions 111, 112 of the magnetic wire 110 are fixed in the two holes or grooves respectively extending through the wire placement portions 130*a*, 131*a* by the resin (not shown) Therefore, the power generation sensor 100 has a structure such that the pair of magnetic flux conducting pieces 130, 131, the coil 120 and the magnetic wire 110 are fixed together for integration.

[First Model]

Figures 2A, 2B, 2C:
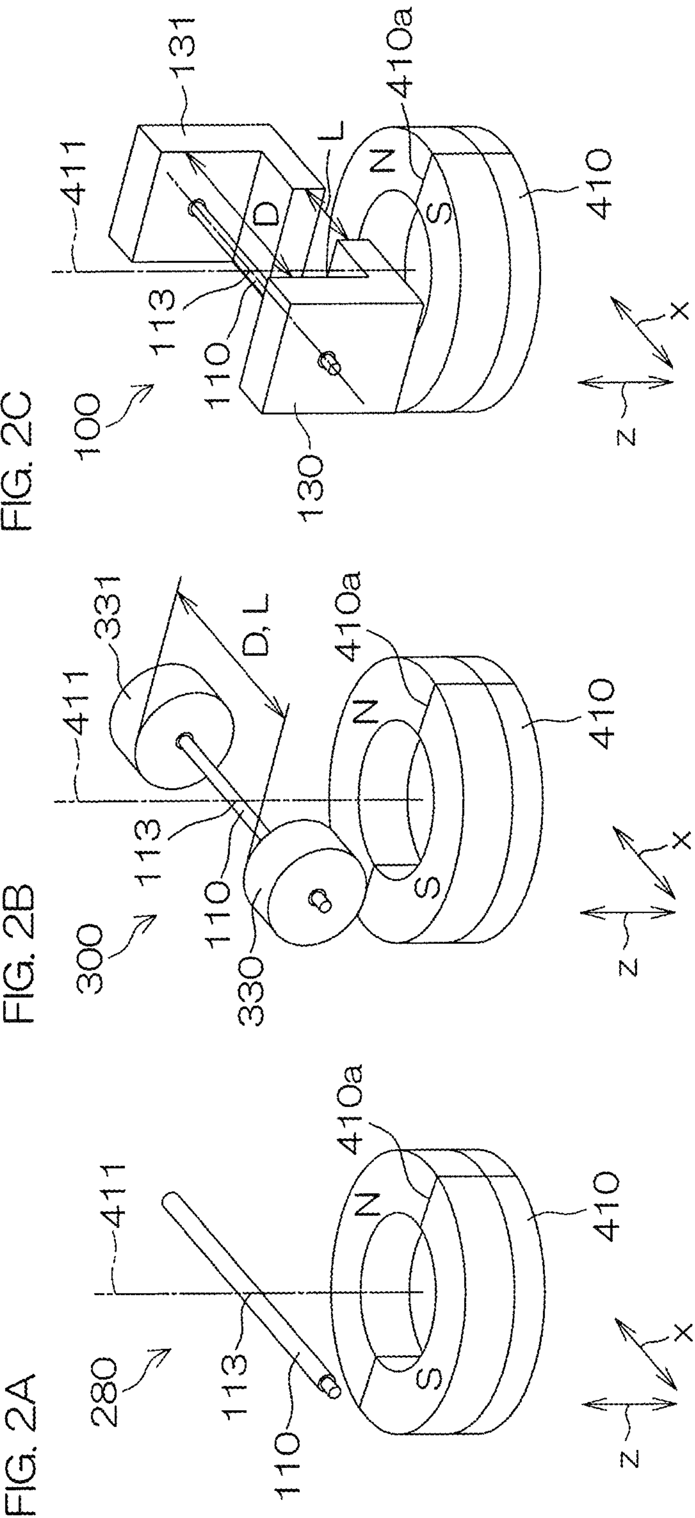
FIGS. 2A, 2B and 2C respectively show rotation detection devices of a first model employing a power generation sensor according to a first comparative example, a power generation sensor according to a second comparative example, and a power generation sensor according to a first preferred embodiment.

FIGS. 2A, 2B and 2C respectively show rotation detection devices of a first model employing a power generation sensor 280 according to a first comparative example, a power generation sensor 300 according to a second comparative example, and the power generation sensor 100 according to the first preferred embodiment. The rotation detection devices each include a magnet 410 rotatable about a rotation axis 411, and the power generation sensor 280, 300, 100, which is disposed with the axially middle position 113 located on the rotation axis 411 and with the axial direction x set orthogonally to the rotation axis 411. In FIGS. 2A, 2B and 2C, however, the coil 120 (see FIGS. 1A and 1B) of the power generation sensor 280, 300, 100 is not illustrated. The magnetic wire 110 is spaced from the magnet 410 in a direction parallel to the rotation axis 411.

The magnet 410 is an example of the magnetic field source 400. In this example, the magnet 410 is a ring-shaped dipole magnet having a diameter smaller than the overall length of the magnetic wire 110, and is configured so that a magnetic field parallel to the axial direction x of the magnetic wire 110 is less liable to be applied to the overall magnetic wire 110. The magnet 410 is a ring-shaped rotary member centered on the rotation axis 411 with its circumferential half region serving as the N-pole region and the other circumferential half region serving as the S-pole region.

FIGS. 2A, 2B and 2C show a state in which an NS-pole boundary 410*a* is located orthogonally to the axial direction x of the magnetic wire 110 as seen in plan along the rotation axis 411 so that a stabilization magnetic field is applied in the axial direction x of the magnetic wire 110.

The power generation sensor 280 according to the first comparative example shown in FIG. 2A includes neither of the magnetic flux conducting pieces 130, 131 of the magnetically-soft components as compared with the first preferred embodiment (see FIG. 2C). The power generation sensor 300 according to the second comparative example shown in FIG. 2B includes magnetically-soft components 330, 331 provided on the opposite end portions of the magnetic wire 110, but the magnetically-soft components 330, 331 are configured differently from the magnetic flux conducting pieces 130, 131 of the first preferred embodiment as compared with the first preferred embodiment (see FIG. 2C). Specifically, the magnetically-soft components 330, 331 each have a cylindrical shape having a center through-hole through which the magnetic wire 110 is inserted, and do not have the L-shaped bent portions opposed to the magnet 410. That is, the magnetically-soft components 330, 331 are not configured to magnetically shield the space between the magnetic wire 110 and the magnet 410. Specifically, the power generation sensor 300 according to the second comparative example is comparable to the structure shown in FIG. 6 of PTL 1. A distance L between the pair of magnetically-soft components 330, 331 as measured at any position in the axial direction x is equal to the distance D between the magnetic wire coupling positions of the magnetically-soft components 330, 331, and is 100% of the distance D.

In the power generation sensor 100 according to the first preferred embodiment shown in FIG. 2C, the distance L between the adjacent ends 134*a* of the axis-parallel portions 134 as measured in the axial direction x is, for example, one third (i.e., 33% of) the distance D between the axis-orthogonal portions 133.

Figures 3A, 3B, 3C:
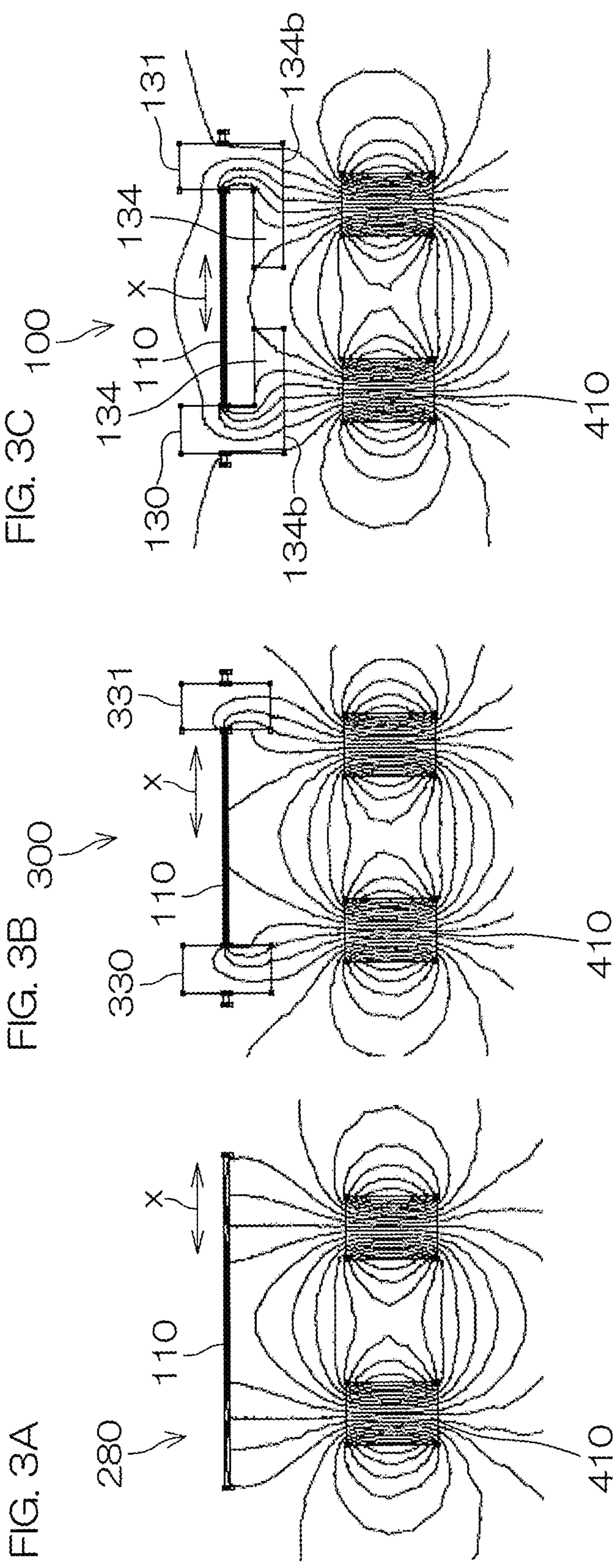
FIGS. 3A, 3B and 3C are schematic sectional views respectively showing the results of two-dimensional magnetic simulations carried out on arrangements shown in FIGS. 2A, 2B and 2C.

FIGS. 3A, 3B and 3C are schematic sectional views respectively showing the results of two-dimensional magnetic simulations carried out on the arrangements shown in FIGS. 2A, 2B and 2C. Specifically, FIGS. 3A, 3B and 3C show the results of the two-dimensional magnetic simulations observed in a vertical sectional plane extending through the axis of the magnetic wire 110 in the arrangements shown in FIGS. 2A, 2B and 2C.

In order to make the magnetic flux distribution of the magnetic wire 110 uniform over the entire axial range, it is desirable that the magnetic flux goes into one of the opposite ends of the magnetic wire 110 and goes out of the other end of the magnetic wire 110.

In the magnetic simulation result of the first comparative example shown in FIG. 3A, most of the magnetic flux generated by the magnetic field source (magnet 410) goes into the axially intermediate portion of the magnetic wire 110, and goes out of the axially intermediate portion of the magnetic wire 110. Therefore, the magnetic flux density is higher in the middle region of the magnetic wire 110 than in the opposite end regions of the magnetic wire 110.

The magnetic simulation result of the second comparative example shown in FIG. 3B indicates that the magnetic flux of the magnetic field source (magnet 410) is attracted to the cylindrical magnetically-soft components 330, 331 and a greater proportion of the magnetic flux goes into the one end of the magnetic wire 110 and goes out of the other end of the magnetic wire 110 as compared with the first comparative example. However, the magnetic flux going into the middle portion of the magnetic wire 110 and going out of the axially intermediate portion of the magnetic wire 110 is still present.

The magnetic simulation result of the first preferred embodiment shown in FIG. 3C indicates that most of the magnetic flux of the magnetic field source (magnet 410) is attracted to the L-shaped magnetic flux conducting pieces 130, 131 of the magnetically-soft components. Only a small proportion of the magnetic flux leaks from the middle gap (distance L), but most of the magnetic flux passes through a path extending from the one end to the other end of the magnetic wire 110. The magnetic flux directed from the magnetic field source (magnet 410) toward the middle portion of the magnetic wire 110 is shielded by the magnetic flux conducting pieces 130, 131 of the magnetically-soft components, particularly by the axis-parallel portions 134. Therefore, no magnetic flux goes into the axially intermediate portion of the magnetic wire 110. More specifically, the magnetic flux from the magnetic field source (magnet 410) goes into the detection region opposition surface 134*b* of the axis-parallel portion 134 of one 130 of the magnetic flux conducting pieces 130, 131, and is conducted through the magnetic flux conducting piece 130 to reach the first end portion 111 of the magnetic wire 110. Further, the magnetic flux from the second end portion 112 of the magnetic wire 110 is conducted through the other magnetic flux conducting piece 131 to reach the axis-parallel portion 134 of the other magnetic flux conducting piece 131, and then goes from the detection region opposition surface 134*b* of the other magnetic flux conducting piece 131 to the magnetic field source (magnet 410). Thus, a uniform magnetic flux distribution can be provided over the entire length of the magnetic wire 110. That is, the magnetic field can be generated parallel to the axial direction x as having a uniform strength over the entire length of the magnetic wire 110. It is noted that the detection region opposition surfaces 134*b* are surfaces that are opposed to the detection region 140 and are parallel to the axial direction x.

In the power generation sensor 100 according to the first preferred embodiment, the magnetic field generated by the magnetic field source (magnet 410) placed in the detection region 140 is thus corrected into the axial magnetic field extending in the axial direction x of the magnetic wire 110 by the function of the magnetic flux conducting pieces 130, 131, and then the axial magnetic field is applied to the magnetic wire 110.

Figure 4A:
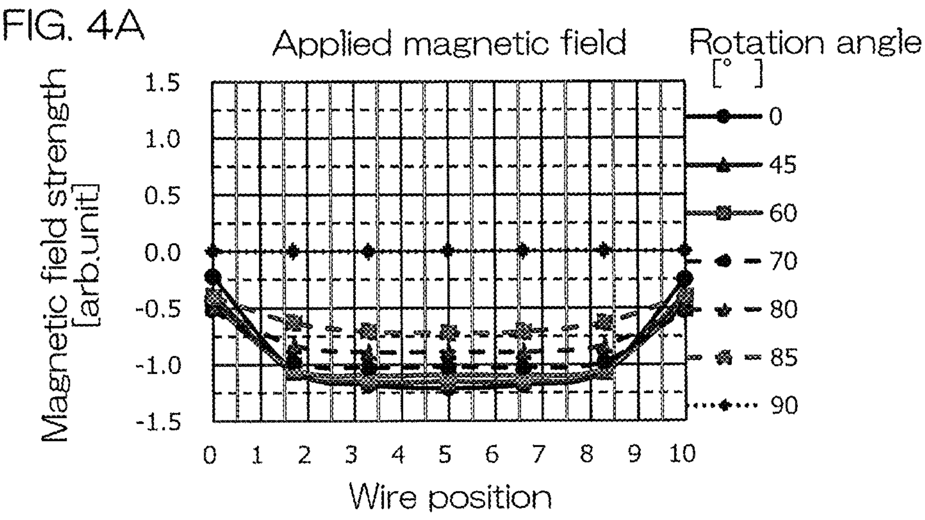
FIGS. 4A, 4B and 4C respectively show the results of three-dimensional magnetic simulations carried out on the arrangements (of the first model) shown in FIGS. 2A, 2B and 2C.
Figure 4B:
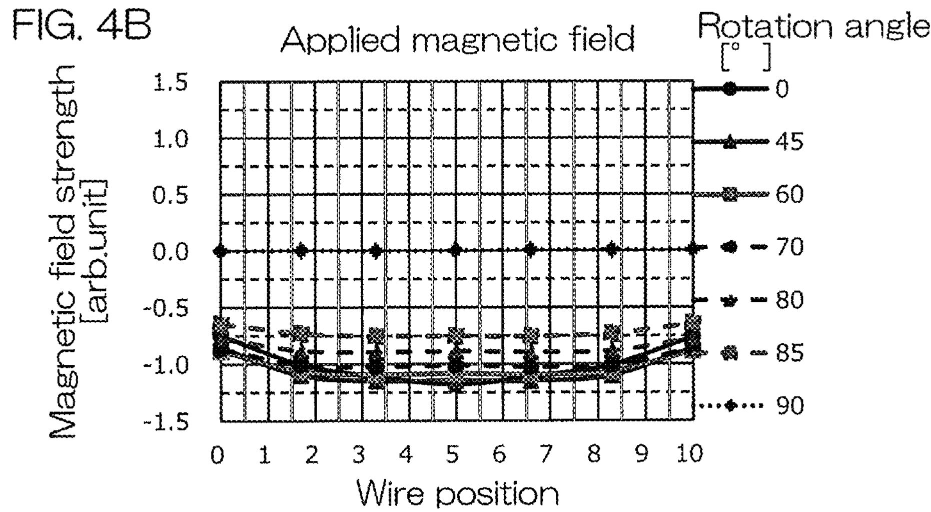
Figure 4C:
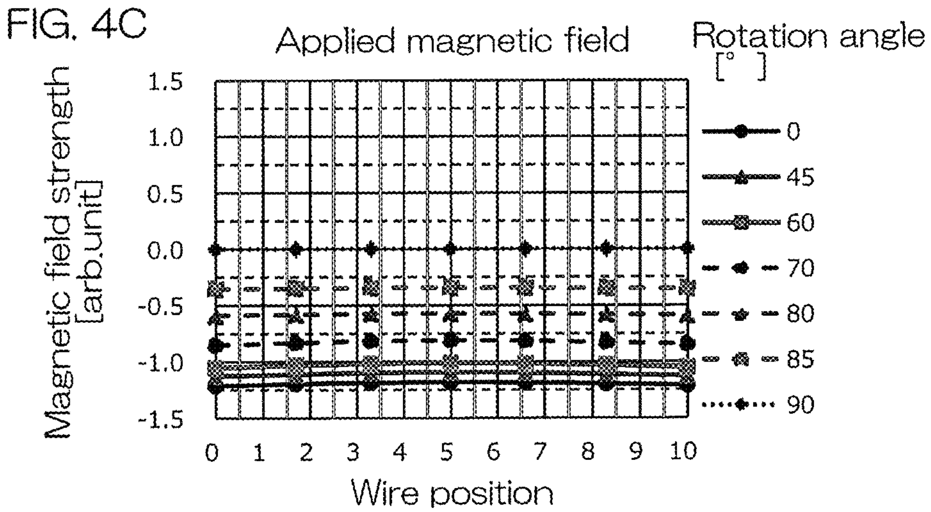

FIGS. 4A, 4B and 4C respectively show the results of three-dimensional magnetic simulations carried out on the arrangements (of the first model) shown in FIGS. 2A, 2B and 2C. With reference to these figures, description will be given to the function of correcting the applied magnetic field into the axial magnetic field extending in the axial direction x of the magnetic wire 110 even when the magnet 410 of the magnetic field source is rotated about the rotation axis 411.

In FIGS. 4A, 4B and 4C, magnetic fields applied to the magnetic wire 110 when the magnet 410 is rotated to plural rotation angles about the rotation axis 411 are shown in the form of graphs. The wire position on the abscissa indicates the positions of different parts of the magnetic wire 110 along the axial direction x. In the arrangements shown in FIGS. 2B and 2C, specifically, a magnetic wire portion between the two inner side surfaces 130*b*, 131*b* of the axis-orthogonal portions 133 of the two magnetic flux conducting pieces 130, 131 opposed to each other in the axial direction x (see FIG. 1B) is equally divided into ten magnetic wire sections, and the position of a magnetic wire section located at one of opposite ends of the magnetic wire portion is denoted by "0" and the position of a magnetic wire section located at the other end of the magnetic wire portion is denoted by "10." In the arrangement shown in FIG. 2A, the corresponding wire positions are also denoted by "0" to "10." Further, a rotation angle of the magnet 410 observed in the arrangements shown in FIGS. 2A to 2C is defined as 0 degree, and a rotation angle of the magnet 410 observed when the magnetic pole boundary 410*a* of the magnet 410 is located parallel to the magnetic wire 110 as seen in plan is defined as 90 degrees. In the first comparative example of FIG. 2A, the second comparative example of FIG. 2B and the first preferred embodiment of FIG. 2C, the magnetic wires 110 have the same overall length and, therefore, the wire positions shown in FIGS. 4A, 4B and 4C are correspondingly defined. In the graphs shown in FIGS. 4A, 4B and 4C, the ordinate indicates the magnetic field strength.

In FIGS. 4A, 4B and 4C, the magnetic simulation results for a first-quadrant rotation angle range, i.e., a range from 0 degree to 90 degrees, are shown. In the first-quadrant rotation angle range, a stabilization magnetic field that can provide a preparatory state (a set state before a plus signal is outputted) in which the magnetization directions of a hard layer and a soft layer are consistent, and an operational magnetic field that can reverse the magnetization direction of the soft layer to cause the hard layer and the soft layer to have opposite magnetization directions (to output a minus signal) are confirmed. The magnetic field strength is standardized so that the stabilization magnetic field has a magnetic field strength of not lower than |±1|. The operational magnetic field has a magnetic field strength of about ±0.5. At wire positions at which the magnetic field strength (of the stabilization magnetic field) is not higher than −1.0 (with an absolute value of not less than 1) in FIGS. 4A, 4B and 4C, the magnetization directions of both the hard layer and the soft layer can be reversed. At wire positions at which the magnetic field strength (of the operational magnetic field) is not higher than −0.5 (with an absolute value of not less than 0.5) in FIGS. 4A, 4B and 4C, the magnetization direction of the soft layer can be reversed. At wire positions at which the magnetic field strength is not greater than −0.5 and greater than −1.0 (with an absolute value of not less than 0.5 and less than 1.0), the magnetization direction of the soft layer can be reversed, but the magnetization direction of the hard layer cannot be reversed.

In the three-dimensional magnetic simulation result for the model utilizing the first comparative example shown in FIG. 4A, the magnetic field strength is significantly different at positions adjacent to the opposite ends of the magnetic wire 110 and at the middle positions of the magnetic wire 110 when the magnet 410 is located at rotation angles at which the stabilization magnetic field (with the magnetic field strength having an absolute value of not less than 1) is applied to some of the wire positions. This indicates that the magnetic field direction does not coincide with the axial direction x of the magnetic wire 110 at the positions adjacent to the opposite ends of the magnetic wire 110. Specifically, the stabilization magnetic field is not applied to wire position Nos. 0 to 2 and 8 to 10 adjacent to the opposite ends of the magnetic wire 110. That is, the stabilization magnetic field is not applied to an about 40% region of the magnetic wire 110, and the hard layer and the soft layer have inconsistent magnetization directions in this 40% region and have consistent magnetization directions in the remaining 60% region. When the operational magnetic field is thereafter applied, therefore, pulse signals each having a very small amplitude are outputted, because the reversal of the magnetization direction of the soft layer occurring in the 60% consistent region is merely contributable to the output.

In the three-dimensional magnetic simulation result for the model utilizing the power generation sensor 300 according to the second comparative example shown in FIG. 4B, variations in the magnetic field strength at the respective wire positions are smaller than in the first comparative example. For the rotation angles at which the magnet 410 applies the stabilization magnetic field (with the magnetic field strength having an absolute value of not less than 1) to some of the wire positions, the inconsistent region in which the hard layer and the soft layer have inconsistent magnetization directions accounts for about 20% (specifically, wire position Nos. 0 to 1 and 9 to 10), and the consistent region accounts for the remaining 80%, so that the simulation result is improved over the first comparative example. When the operational magnetic field is thereafter applied, however, pulse signals each having a smaller amplitude are outputted, because the reversal of the magnetization direction of the soft layer occurring in the 80% consistent region is merely contributable to the output and the intrinsic property of the magnetic wire 110 cannot be fully utilized.

In the three-dimensional magnetic simulation result for the model utilizing the power generation sensor 100 according to the first preferred embodiment shown in FIG. 4C, there is no substantial difference in the magnetic field strength at the positions adjacent to the opposite ends of the magnetic wire 110 and at the middle positions of the magnetic wire 110 for all the magnet rotation angles. This indicates that the magnetic field applied to the magnetic wire 110 is parallel to the axial direction x of the magnetic wire 110 over the entire length of the magnetic wire 110 with the magnet 410 located at any of the rotation angles. In other words, this indicates that the magnetic field generated by the magnet 410 is corrected into an axial magnetic field parallel to the axial direction x of the magnetic wire 110, and the axial magnetic field is applied to the magnetic wire 110.

In the arrangements of the first model, the magnetic field source (magnet 410), which is relatively small, cannot generate an alternating magnetic field parallel to the axial direction x of the magnetic wire 110 in a space in which the power generation sensor 100 is placed. Nevertheless, the power generation sensor 100 according to the first preferred embodiment makes it possible to correct an alternating magnetic field generated by the movement of the magnetic field source (magnet 410) into an axial magnetic field parallel to the axial direction x of the magnetic wire 110 and apply the axial magnetic field to the magnetic wire 110. Since the stabilization magnetic field can be thus applied over the entire length of the magnetic wire 110, there is no inconsistent region in which the magnetization directions of the hard layer and the soft layer are inconsistent. Therefore, the intrinsic property of the magnetic wire 110 can be fully utilized, making it possible to stably output high-power pulse signals.

[Second Model]

Figures 5A, 5B:
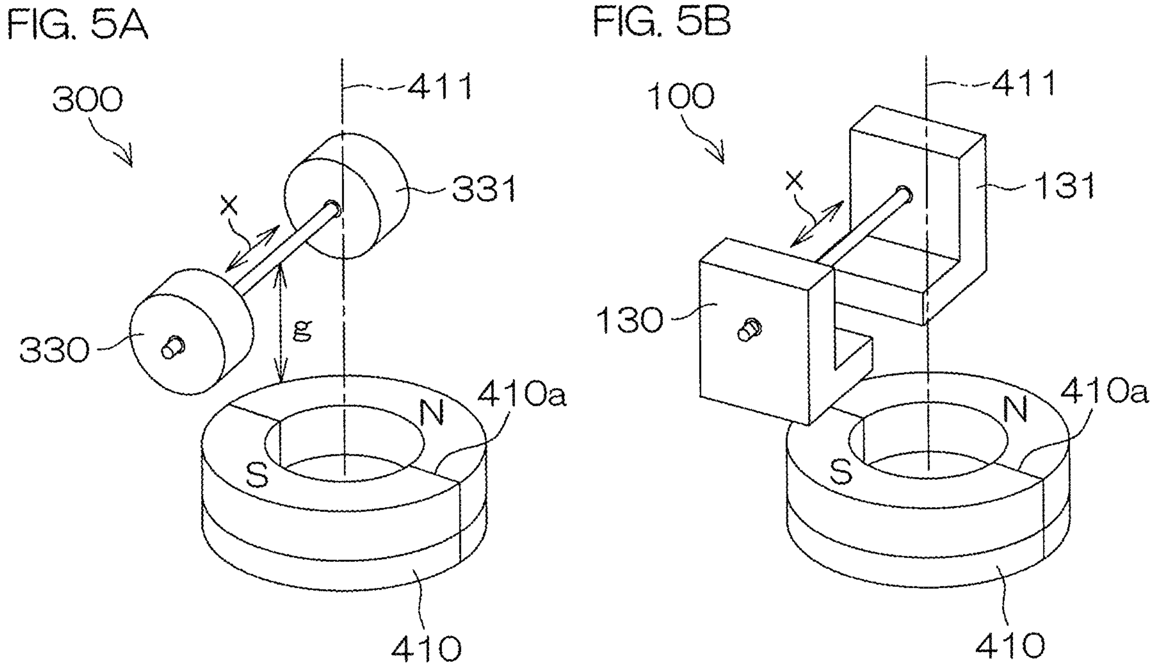
FIGS. 5A and 5B respectively show rotation detection devices of a second model employing the power generation sensor according to the second comparative example and the power generation sensor according to the first preferred embodiment.

FIGS. 5A and 5B respectively show rotation detection devices of a second model employing the power generation sensor 300 according to the second comparative example and the power generation sensor 100 according to the first preferred embodiment. The rotation detection devices each include a magnet 410 rotatable about its rotation axis 411, and the power generation sensor 300, 100, which is disposed with the axially middle position 113 offset from the rotation axis 411 orthogonally to the rotation axis 411. The power generation sensor 300, 100 is disposed with the axial direction x of the magnetic wire 110 extending along the tangential line of a virtual circle defined about the rotation axis 411. In FIGS. 5A and 5B, however, the coil 120 (see FIGS. 1A and 1B) of the power generation sensor 300, 100 is not illustrated. The magnetic wire 110 is opposed to the magnet 410, and spaced a gap g from the magnet 410 parallel to the rotation axis 411. The magnet 410 as the detection medium is an example of the magnetic field source 400, and is a ring-shaped dipole magnet as in the first model.

Figure 6A:
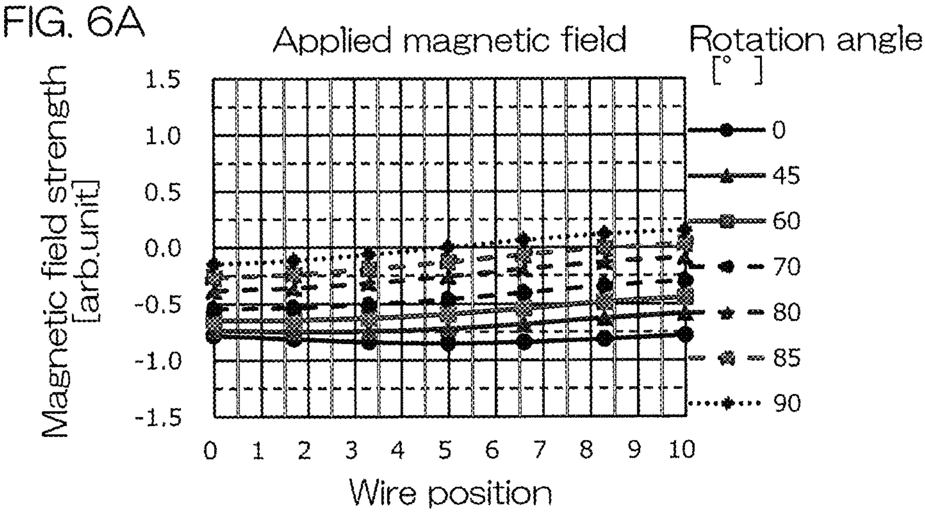
FIGS. 6A and 6B respectively show the results of three-dimensional magnetic simulations carried out on arrangements (of the second model employing the power generation sensor according to the second comparative example) shown in FIG. 5A.
Figure 6B:
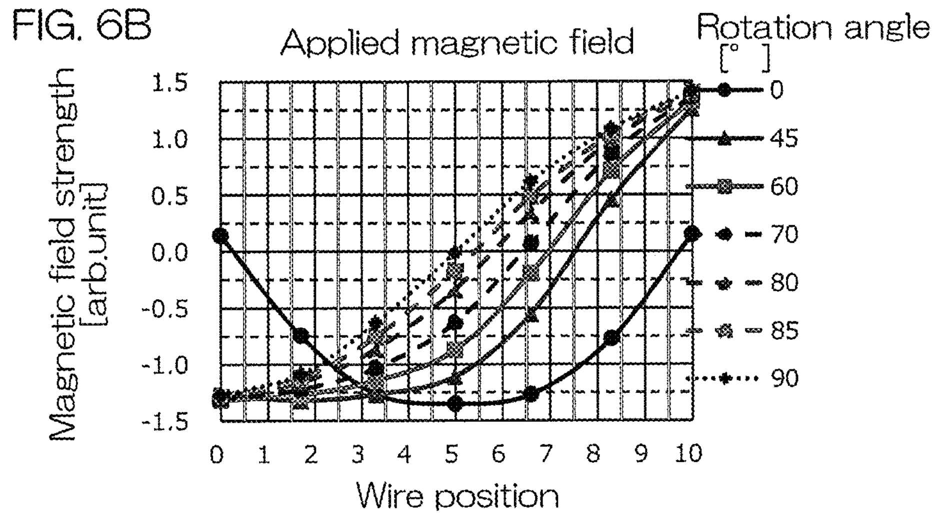
Figure 6C:
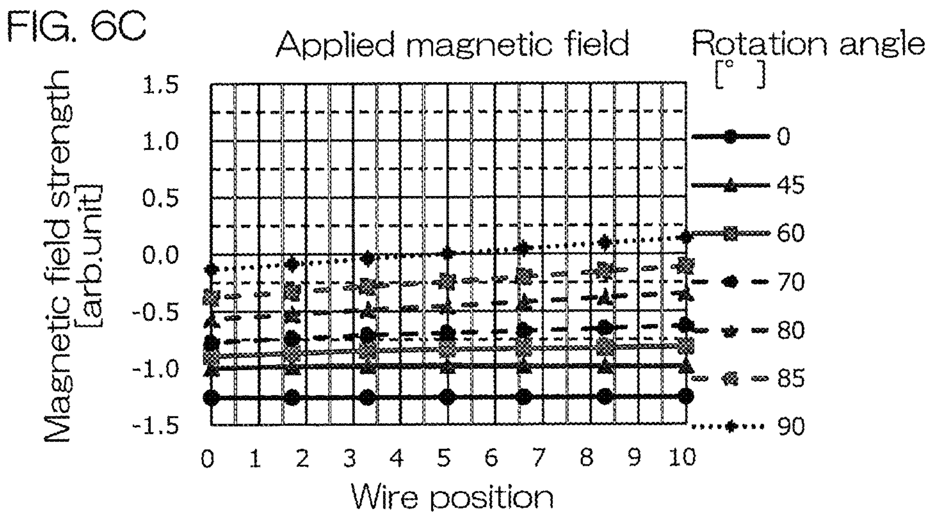
FIG. 6C shows the result of a three-dimensional magnetic simulation carried out on an arrangement (of the second model employing the power generation sensor according to the first preferred embodiment) shown in FIG. 5B.

FIGS. 6A and 6B respectively show the results of three-dimensional magnetic simulations carried out on arrangements (of the second model employing the power generation sensor 300 according to the second comparative example) shown in FIG. 5A. Further, FIG. 6C shows the result of a three-dimensional magnetic simulation carried out on an arrangement (of the second model employing the power generation sensor 100 according to the first preferred embodiment) shown in FIG. 5B. In FIGS. 6A to 6C, magnetic fields applied to the magnetic wire 110 when the magnet 410 is rotated to plural rotation angles about the rotation axis 411 are shown in the form of graphs as in FIGS. 4A to 4C. The wire position on the abscissa and the magnetic field strength on the ordinate are defined in the same manner as those described with reference to FIGS. 4A to 4C and, therefore, duplicate description will be omitted.

FIG. 6A shows a magnetic simulation result obtained when the air gap g (the distance between the magnet surface and the magnetic wire 110) of the power generation sensor 300 is the same as that shown in FIG. 2B (the corresponding magnetic simulation result is shown in FIG. 4B). In FIG. 6A, the magnetic field strength is substantially uniform over the entire region of the magnetic wire 110 for all the magnet rotation angles. However, the magnetic field strength has an absolute value of less than 1 with the magnet 410 located at any of the rotation angles, so that the stabilization magnetic field cannot be applied to the magnetic wire 110.

FIG. 6B shows a magnetic simulation result obtained when the air gap g of the power generation sensor 300 according to the second comparative example is narrowed (the power generation sensor 300 is moved toward the magnet 410) to a position such that the stabilization magnetic field can be applied to the magnetic wire 110 in the model shown in FIG. 5A. As shown in FIG. 6B, the stabilization magnetic field (with the magnetic field strength having an absolute value of not less than 1) can be applied to the wire positions Nos. 2 to 8 of the magnetic wire 110 when the rotation angle is 0 degree. Therefore, the magnetization directions of the hard layer and the soft layer are consistent in about 60% of the entire axial length range of the magnetic wire 110 (at the wire position Nos. 2 to 8). This is defined as a set state before a pulse signal is outputted (preparatory state), and the operational magnetic field (having a magnetic field strength of not lower than +0.5) that can reverse the magnetization direction of the soft layer in this state is applied to the wire position No. 8 of the magnetic wire 110 when the rotation angle is about 60 degrees in the first-quadrant rotation angle range. When the rotation angle is about 60 degrees, however, a magnetic field (having a negative magnetic field strength) is applied, for example, to the wire positions Nos. 0 to 6 of the magnetic wire 110 in a direction that hinders the operational magnetic field. Therefore, the reversal of the magnetization direction of the soft layer occurs only in an about 20% region (in the range of the wire position Nos. 6 to 8).

This phenomenon occurs in the first-quadrant rotation angle range supposedly because the alternating magnetic field occurring at the position opposed to the rotation track of the magnet 410 contains an undesired harmonic component that interferes with a magnetic field component occurring in the axial direction x of the magnetic wire 110.

In the result of the three-dimensional magnetic simulation carried out on the model utilizing the power generation sensor 100 according to the first preferred embodiment shown in FIG. 6C, there is no substantial difference in the magnetic field strength at the positions adjacent to the opposite ends of the magnetic wire 110 and at the middle positions of the magnetic wire 110 for all the magnet rotation angles. This indicates that the magnetic field applied to the magnetic wire 110 is parallel to the axial direction x of the magnetic wire 110 over the entire length of the magnetic wire 110 with the magnet 410 located at any of the rotation angles. In other words, this indicates that the magnetic field generated by the magnet 410 is corrected into the axial magnetic field parallel to the axial direction x of the magnetic wire 110 and the axial magnetic field is applied to the magnetic wire 110.

In the arrangements of the second model, the power generation sensors 300, 100 are each disposed in a space in which the alternating magnetic field is generated in overlapping relation with the undesired harmonic component by the movement of the magnetic field source (magnet 410). Nevertheless, in the power generation sensor 100 according to the first preferred embodiment, the alternating magnetic field generated by the movement of the magnetic field source (magnet 410) is corrected into the axial magnetic field extending in the axial direction x of the magnetic wire 110, and the axial magnetic field is applied over the entire length of the magnetic wire 110. Thereby, the inconsistent region in which the magnetization directions of the hard layer and the soft layer are inconsistent can be substantially eliminated. Therefore, the intrinsic property of the magnetic wire 110 can be fully utilized, making it possible to stably output high-power pulse signals.

The second model is advantageous in that, with the power generation sensor 100 offset from the rotation axis 411, a shaft-through type device can be provided.

The art disclosed in PTL 3 utilizes a magnet including regions having different magnetic field strengths to reduce the strength of a magnetic field nonparallel to the axial direction x of the magnetic wire. As shown in FIG. 3 or 5 of PTL 3, this art is contributable to improvement in the magnetic field strength, but needs further improvement of the magnet as the detection medium. In contrast, the power generation sensor 100 according to the first preferred embodiment does not necessarily need the improvement of the magnet, but can solve the disadvantage of the arrangement of PTL 3.

[Third Model]

Figure 7A:
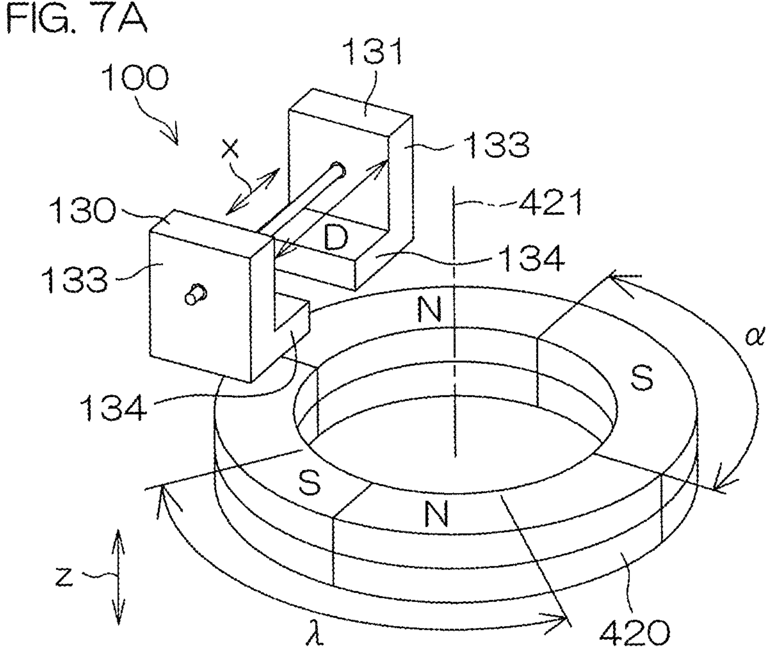
FIGS. 7A and 7B show rotation detection devices of a third model each employing the power generation sensor according to the first preferred embodiment.
Figure 7B:
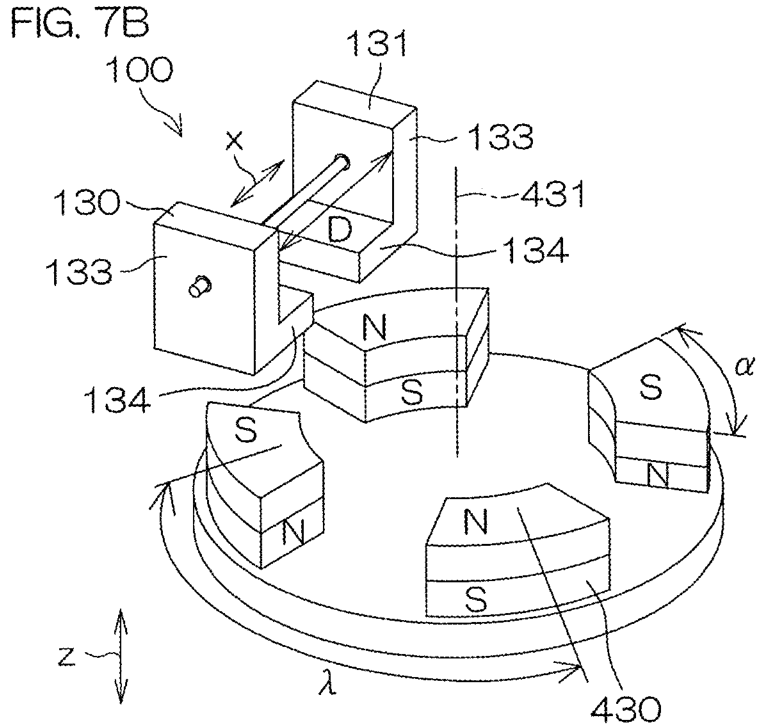

FIGS. 7A and 7B show rotation detection devices of a third model each employing the power generation sensor 100 according to the first preferred embodiment. In the second model shown in FIG. 5B, the dipole magnet 410 is used as the magnetic field source, and the power generation sensor 100 according to the first preferred embodiment is offset from the rotation axis 411 of the magnet 410. In contrast, the third model shown in FIGS. 7A and 7B is a rotation detection device including a multi-pole magnetic field source. Description will hereinafter be given to a fact that the rotation of the multi-pole magnet can be detected, based on the magnetic simulation result indicating the strength of a magnetic field applied to the magnetic wire 110 when the multi-pole magnet of the magnetic field source is rotated.

The magnetic field source is a magnet having four magnetic poles (i.e., two N-poles and two S-poles) passing through the detection region 140 of the power generation sensor 100. In an arrangement shown in FIG. 7A, specifically, a ring-shaped magnet 420 having four magnetic pole regions including N-pole regions and S-pole regions circumferentially alternately arranged on a surface thereof opposed to the power generation sensor 100 is provided as the magnetic field source. The ring-shaped magnet 420 is rotatable about a rotation axis 421 coinciding with its center axis to thereby form an alternating magnetic field in the detection region 140 of the power generation sensor 100. In an arrangement shown in FIG. 7B, the magnetic field source includes four separate magnets 430. The four magnets 430 are permanent magnets having the same shape and the same size and disposed circumferentially of a circle defined about a rotation axis 431 (e.g., disposed equidistantly circumferentially of the circle). The four magnets 430 are rotatable about the rotation axis 431 with their relative positions maintained about the rotation axis 431. The respective magnets 430 are disposed with their magnetization directions set parallel to the rotation axis 431. The four magnets 430 are disposed with their N-poles and S-poles alternately arranged in a rotation direction on a side thereof opposed to the power generation sensor 100. When the four magnets 430 are rotated about the rotation axis 431, therefore, the N-poles and the S-poles are alternately opposed to the power generation sensor 100, whereby the alternating magnetic field is generated in the detection region 140 of the power generation sensor 100.

In the ring-shaped magnet 420 shown in FIG. 7A, the magnetic pole regions each have a circumferential length (α) that is equal to a magnetic pole pitch λ which is defined as a length between the circumferential middle position of the N-pole region and the circumferential middle position of the S-pole region. In the separate magnets shown in FIG. 7B, the magnetic poles each have a circumferential length (α) that is shorter than a magnetic pole pitch λ which is defined as a distance between circumferential middle positions of each adjacent pair of magnets.

The power generation sensor 100 is disposed with its magnetic wire 110 offset in a rotation radial direction from the rotation axis 421, 431 of the magnet 420, 430. That is, the magnetic wire 110 is offset to a position opposed to the rotation track of the magnet 420, 430 in a direction parallel to the rotation axis 421, 431 (in the orthogonal direction z). The power generation sensor 100 is disposed with the axial direction x of the magnetic wire 110 extending along the tangential line of a virtual circuit defined about the rotation axis 421, 431 and with the detection region 140 (see FIG. 1B) located on the side of the magnet 420, 430. In the arrangements shown in FIGS. 7A and 7B, the magnetic pole pitch λ is set to not greater than the distance D between the axis-orthogonal portions 133 of the magnetic flux conducting pieces 130, 131.

Figure 8:
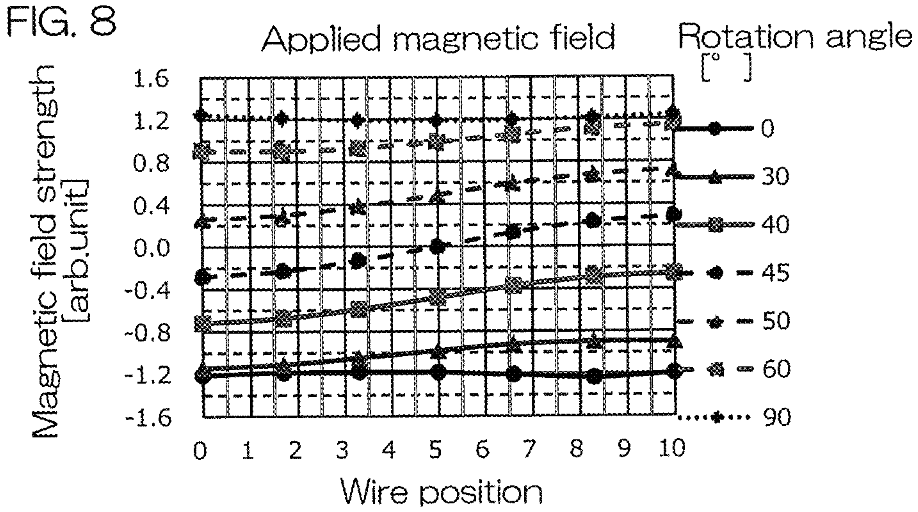
FIG. 8 shows the result of a three-dimensional magnetic simulation carried out on an arrangement shown in FIG. 7B.

FIG. 8 shows the result of a three-dimensional magnetic simulation carried out on the arrangement shown in FIG. 7B. In FIG. 8, a magnetic field applied to the magnetic wire 110 when the four magnets 430 are rotated to plural rotation angles about the rotation axis 431 is shown in the form of graph. The wire position on the abscissa and the magnetic field strength on the ordinate are defined in the same manner as those shown in FIGS. 4A to 4C and, therefore, duplicate description will be omitted. A rotation angle in a state shown in FIG. 7B is defined as 0 degree, and a rotation angle in a state observed after rotation by the magnetic pole pitch λ is defined as 90 degrees.

As shown in FIG. 8, there is no substantial difference in the magnetic field strength at the positions adjacent to the opposite ends of the magnetic wire 110 and at the middle positions of the magnetic wire 110 for all the magnet rotation angles. This indicates that the magnetic field applied to the magnetic wire 110 is parallel to the axial direction x of the magnetic wire 110 over the entire length of the magnetic wire 110 with the magnets 430 located at any of the rotation angles. In other words, the magnetic field generated by the magnets 430 is corrected into an axial magnetic field parallel to the axial direction x of the magnetic wire 110, and the axial magnetic field is applied to the magnetic wire 110.

Further, FIG. 8 indicates that a stabilization magnetic field on the minus side (a magnetic field having a magnetic field strength of not greater than −1 (with an absolute value of not less than 1)), a stabilization magnetic field on a plus side (a magnetic field having a magnetic field strength of not less than +1), an operational magnetic field on the minus side (a magnetic field having a magnetic field strength of not greater than −0.5 (with an absolute value of not less than 0.5)), and an operational magnetic field on the plus side (a magnetic field having a magnetic field strength of not less than +0.5) are applied during the rotational movement during which the rotation angle is changed from 0 degree to 90 degrees. In other words, a set state (preparatory state) in which the magnetization directions of the hard layer and the soft layer are consistent before a plus signal is outputted, a state in which the operational magnetic field is applied in the set state to reverse only the magnetization direction of the soft layer to output the plus signal, a set state (preparatory state) in which the magnetization directions of the hard layer and the soft layer are consistent before a minus signal is outputted, and a state in which the operational magnetic field is applied in the set state to reverse only the magnetization direction of the soft layer to output the minus signal are achieved during the rotational movement during which the rotation angle is changed from 0 degree to 90 degrees. Therefore, two plus signal pulses and two minus signal pulses, i.e., a total of four signal pulses, are outputted, while the four magnets 430 make one turn (360-degree turn) about the rotation axis 431. Though not shown, the result of the three-dimensional magnetic simulation carried out on the arrangement shown in FIG. 7A is substantially the same as that shown in FIG. 8.

Even in the third model in which the multi-pole magnet 420, 430 is used as the magnetic field source and, hence, the magnetic pole pitch is shorter than in the second model, it is possible to achieve the function of correcting the alternating magnetic field generated in the detection region 140 by the movement of the multi-pole magnet into an axial magnetic field extending in the axial direction x of the magnetic wire 110.

Even where the shaft-through type rotation detection device such as of the third model is configured so as to be capable of outputting a plurality of pulses during each turn, the configuration of the rotation detection device can be simplified by using the power generation sensor 100 according to the first preferred embodiment. That is, there is no need to specially design the shapes and the layout of the magnetic members according to the configuration of the rotation detection device and prepare the magnetic members as in PTL 4 and PTL 5.

Next, description will be given to a relationship of the distance D between the magnetic wire positions of the two magnetic flux conducting pieces 130, 131 as measured in the axial direction x versus the gap (distance L) between the two magnetic flux conducting pieces 130, 131 opposed to each other at a position offset from the magnetic wire 110 to the detection region 140. Specifically, the distance D is a distance between the inner side surfaces 130*b*, 131*b* of the pair of axis-orthogonal portions 133 opposed to each other as measured in the axial direction x. Specifically, the distance L is a distance between the adjacent ends 134*a* of the pair of axis-parallel portions 134 as measured in the axial direction x. Since the magnetic flux conducting pieces 130, 131 have symmetrical shapes with respect to the symmetry plane 115 extending through the axially middle position 113 of the magnetic wire 110, the pair of adjacent ends 134*a* are opposed to each other with the axially middle position 113 interposed therebetween as seen from the detection region 140 (see FIG. 1B).

Hereinafter, description will be given to the result of an experiment on the ratio of the distance L between the adjacent ends 134*a* of the axis-parallel portions 134 to the distance D between the axis-orthogonal portions 133.

Figure 9:
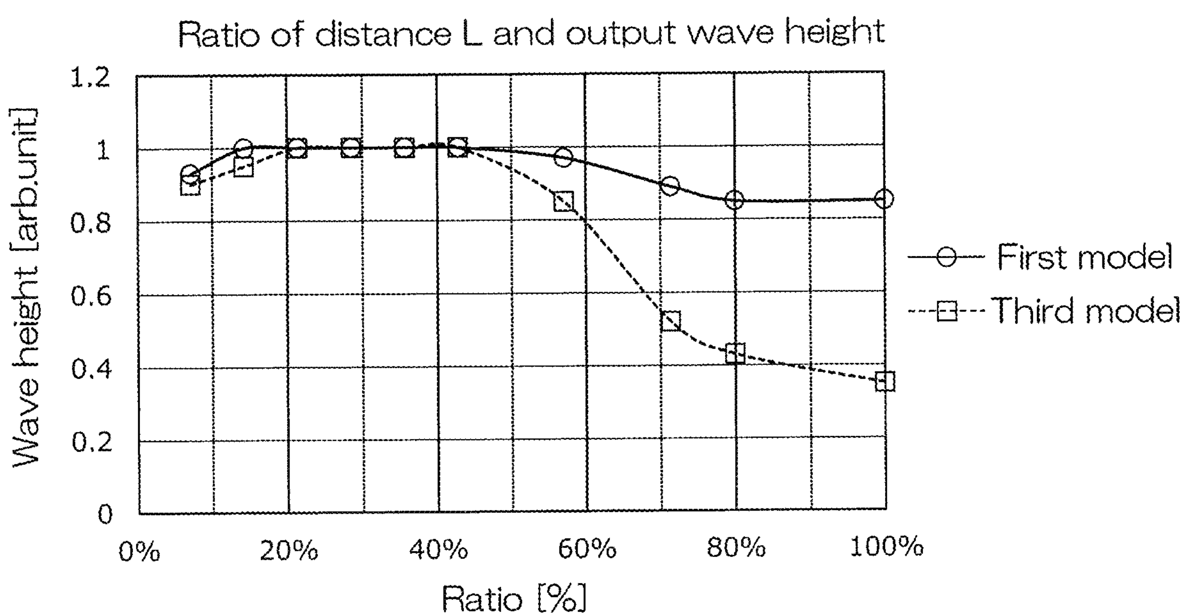
FIG. 9 shows a relationship of the wave height of a pulse signal outputted from a coil versus the ratio of a distance between the adjacent ends of a pair of magnetic flux conducting pieces to a distance between the magnetic wire positions of the pair of magnetic flux conducting pieces as determined for the structures of the first model (see FIG. 2C) and the third model (see FIG. 7B) each employing the power generation sensor according to the first preferred embodiment.

For the arrangements of the first model (see FIG. 2C) and the third model (see FIG. 7B) each utilizing the power generation sensor 100 according to the first preferred embodiment, a relationship of the wave height of a pulse signal outputted from the coil 120 versus the ratio of the distance L between the adjacent ends 134*a* to the distance D between the magnetic wire positions of the magnetic flux conducting pieces 130, 131 was checked. The result is shown in FIG. 9. In FIG. 9, the abscissa indicates the ratio (%) of the distance L to the distance D, and the ordinate indicates the wave height. The output wave height is standardized with its maximum value defined as 1. The wave height of the pulse signal is determined as an average of the absolute values of the wave heights of two positive and negative pulses outputted when the magnet(s) 410, 430 is/are rotated in a forward rotation direction and the absolute values of the wave heights of two positive and negative pulses outputted when the magnet(s) 410, 430 is/are rotated in a reverse rotation direction.

FIG. 9 indicates that the magnetic wire 110 can exhibit 100% of its intrinsic large Barkhausen effect when the ratio is about 15% to about 50% in the first model and when the ratio is about 20% to about 45% in the third model.

Where the ratio is about 5%, the large Barkhausen effect is reduced by several percent from the intrinsic large Barkhausen effect of the magnetic wire 110 in both the first model and the third model. This is supposedly because the gap (distance L) between the adjacent ends 134*a* of the axis-parallel portions 134 is smaller and the large Barkhausen effect is influenced by a magnetic path formed as extending through this smaller gap.

Where the ratio is not less than about 50%, the large Barkhausen effect is smaller than the intrinsic large Barkhausen effect of the magnetic wire 110 in both the first model and the third model. This is supposedly because the surface areas of the magnetically-soft components opposed to the magnet(s) 410, 430 are reduced. That is, an area of the magnetic wire 110 shielded from the magnet(s) 410, 430 by the axis-parallel portions 134 of the magnetic flux conducting pieces 130, 131 is reduced, whereby the large Barkhausen effect is influenced by the reduction in the shielding effect described above.

An output wave height of 0.85 observed when the ratio is 100% in the first model corresponds to an output which is slightly higher than that observed in the three-dimensional magnetic simulation result of FIG. 4B (corresponding to the arrangement of FIG. 2B) in which the consistent region (where the magnetization directions of the hard layer and the soft layer are consistent) accounts for 80%. An output wave height of 0.35 observed when the ratio is 100% in the third model corresponds to an output which is slightly higher than that observed in the three-dimensional magnetic simulation result of FIG. 6B (corresponding to the arrangement of FIG. 5A) in which the consistent region (where the magnetization directions of the hard layer and the soft layer are consistent) accounts for 20% though the magnetic pole pitch is different. This indicates that the planar surfaces (the detection region opposition surfaces 134*b*, see the arrangement of the power generation sensor 100 according to the first preferred embodiment) are more excellent as the surfaces opposed to the magnetic field source than the cylindrical curved surfaces (see the arrangement according to the second comparative example shown in FIGS. 2B and 5A).

Where the ratio is in a range of 5% to 50%, the magnetic wire 110 can exhibit not less than 90% of its intrinsic large Barkhausen effect. Further, where the ratio is in a range of 20% to 40%, the magnetic wire 110 can exhibit 100% of its intrinsic large Barkhausen effect.

As described above, the magnetic flux conducting pieces 130, 131 of the magnetically-soft components have the function of correcting the alternating magnetic field generated in the detection region 140 by the magnetic field source into the axial magnetic field extending in the axial direction x of the magnetic wire 110 and applying the axial magnetic field to the magnetic wire 110. Thus, a signal induced in the coil 120 wound around the magnetic wire 110 becomes a high power output signal. The power generation sensor 100 including the magnetic flux conducting pieces 130, 131 unified therewith and having the magnetic field correcting function can be used for various detection media.

The ratio of the distance L between the adjacent ends 134*a* opposed to each other at the position offset from the magnetic wire 110 toward the detection region 140 to the distance D between the magnetic wire positions of the pair of magnetic flux conducting pieces 130, 131 is set in the aforementioned range, whereby the magnetic flux conducting pieces 130, 131 provide an excellent magnetic field correcting function as described above. Even if the magnetic wire 110 has a different axial length, it is merely necessary to design the power generation sensor 100 so as to satisfy the requirement for the range of the ratio. This facilitates the shape design of the magnetic flux conducting pieces 130, 131.

As shown in FIGS. 1A and 1B, the first end portion 111 and the second end portion 112 of the magnetic wire 110 are respectively exposed from the magnetic flux conducting pieces 130, 131 of the magnetically-soft components. However, the first end portion 111 and the second end portion 112 are not necessarily required to be respectively exposed from the magnetic flux conducting pieces 130, 131. Where the first end portion 111 and the second end portion 112 are exposed, the first end portion 111 and the second end portion 112 may project or may not project from the magnetic flux conducting pieces 130, 131, respectively, in the axial direction x. If the first end portion 111 and the second end portion 112 project, their projection lengths are not limited. The diameter of each of the holes or the width of each of the grooves formed as the wire placement portions 130*a*, 131*a* in the magnetic flux conducting pieces 130, 131 of the magnetically-soft components as extending therethrough in the axial direction x is preferably a hole diameter or a groove width that substantially permits the sliding (sliding contact) of the magnetic wire 110 without application of any stress to the magnetic wire 110 in use. Specifically, the hole diameter or the groove width may be set greater by several percent than the diameter of the magnetic wire 110.

The wire placement portions 130*a*, 131*a* are preferably offset toward a side not opposed to the magnetic field source, i.e., are preferably offset away from the detection region 140, with the magnetic flux conducting pieces 130, 131 seen in the axial direction x. That is, as shown in FIG. 1A, a distance h from the magnetic wire 110 to an end of each of the axis-orthogonal portions 133 (opposite from the detection region 140) and a distance H from the magnetic wire 110 to each of the detection region opposition surfaces 134*b* of the magnetic flux conducting pieces 130, 131 preferably satisfy a relationship $h<H$. More preferably, where the distance h is substantially equal to the radius of the coil 120, the length $h+H$ of each of the magnetic flux conducting pieces 130, 131 as measured in the orthogonal direction z is reduced, so that the size of the power generation sensor 100 as measured in the orthogonal direction z can be reduced. Further, where the width t of each of the magnetic flux conducting pieces 130, 131 is substantially equal to the diameter of the coil 120 with the magnetic flux conducting pieces 130, 131 seen in the axial direction x, the size of the power generation sensor 100 as measured in a width direction y can be reduced. Thus, the power generation sensor 100 can have a reduced size.

The magnetically-soft components for the magnetic flux conducting pieces 130, 131 are each preferably formed of a magnetic material having a coercivity not greater than that of the magnetic wire 110 and having a higher relative magnetic permeability (e.g., not lower than 500). Specifically, preferred examples of the magnetic material include a Ni-ferrite-containing material and a Mn-ferrite-containing material. These materials have excellent characteristic properties, e.g., smaller hysteresis, lower self-dielectric property, lower iron loss and the like and, therefore, are advantageous in that the output characteristics are not influenced even if a high-frequency alternating magnetic field generated when the magnetic field source is moved at a higher speed is applied to the power generation sensor 100.

If the width of the hole formed as extending through the magnetic flux conducting piece 130, 131, i.e., the thickness W of the axis-orthogonal portion 133 (see FIG. 1A), is excessively great, the width of a space in which the coil 120 is disposed is reduced to thereby reduce the pickup efficiency of the large Barkhausen effect of the magnetic wire 110. If the hole width is excessively small, the magnetic path is narrower. Therefore, the thickness W is preferably 10% to 20% of the entire length of the magnetic wire 110 according to the teaching of an experiment.

Modification of First Preferred Embodiment

Figure 10:
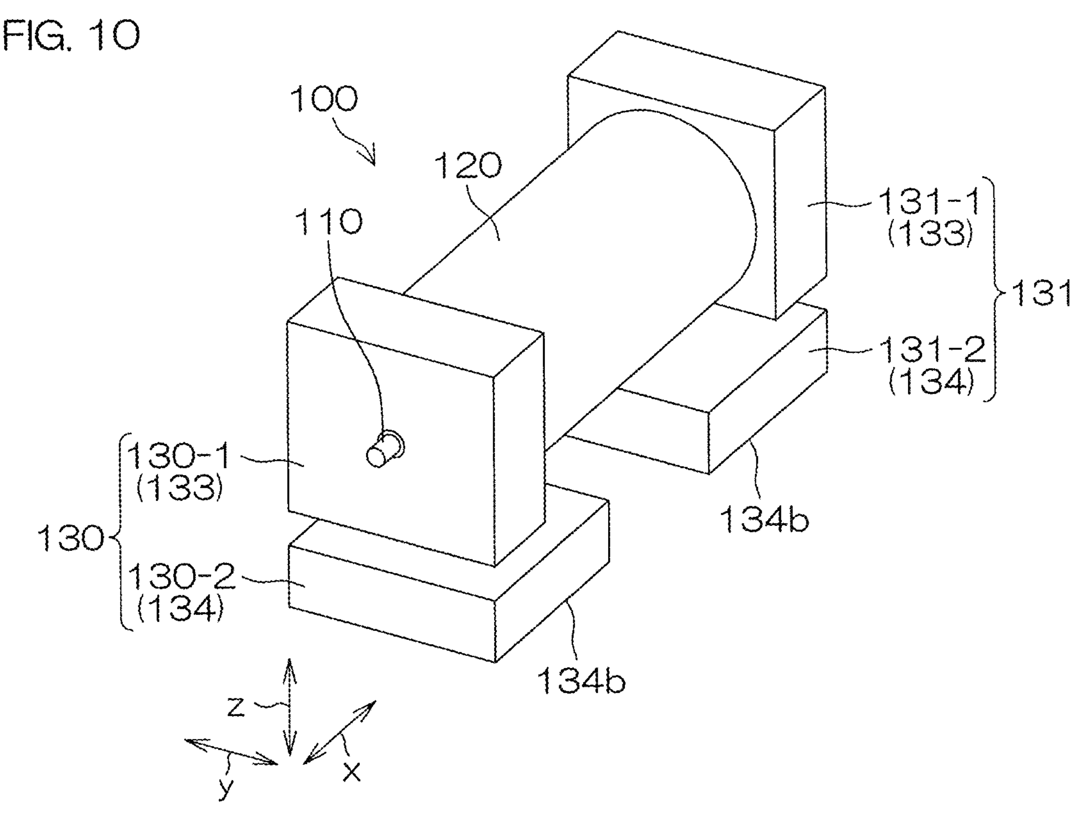
FIG. 10 shows a modification of the first preferred embodiment.

In the first preferred embodiment, the magnetic flux conducting pieces 130, 131 of the magnetically-soft components are L-shaped unitary members, but may each include a combination of two rectangular parallelepiped portions 130-1, 130-2; 131-1, 131-2 respectively serving as the axis-orthogonal portion 133 and the axis-parallel portion 134 as shown in FIG. 10. In this case, the two rectangular parallelepiped portions 130-1, 130-2; 131-1, 131-2 are preferably combined together to form the L-shaped member. However, the two rectangular parallelepiped portions 130-1, 130-2; 131-1, 131-2 are not necessarily required to be combined together into a perfect L-shape but, for example, an end surface of the rectangular parallelepiped portion 130-1, 131-1 of the axis-orthogonal portion may be disposed in abutment against an axially middle portion of the rectangular parallelepiped portion 130-2, 131-2 of the axis-parallel portion (in a T-shaped arrangement). The two rectangular parallelepiped portions 130-1, 130-2; 131-1, 131-2 of each of the magnetic flux conducting pieces 130, 131 may be composed of the same magnetically-soft material, or may be composed of different magnetically-soft materials, which are preferably selected from the material category described above.

Second Preferred Embodiment

The magnetic flux conducting pieces 130, 131 of the power generation sensor 100 according to the first preferred embodiment each have a planar surface opposed to the magnetic field source (opposed to the detection region 140). Therefore, this planar surface can be utilized as a surface mount area.

Figure 11A:
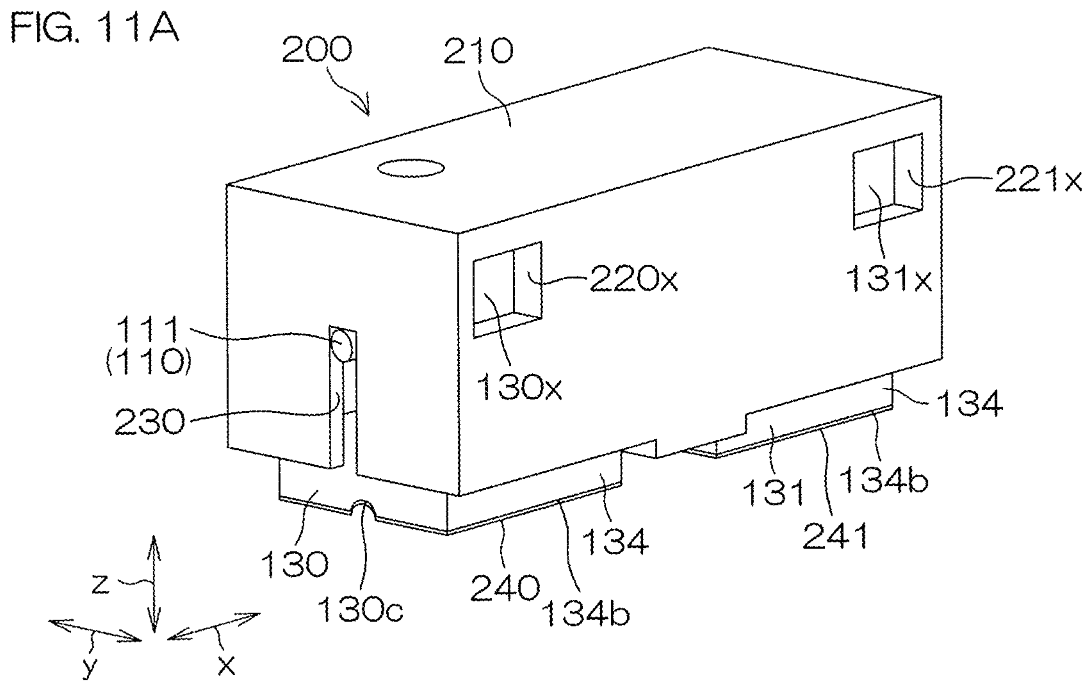
FIG. 11A is a perspective view of a power generation sensor according to a second preferred embodiment.
Figure 11B:
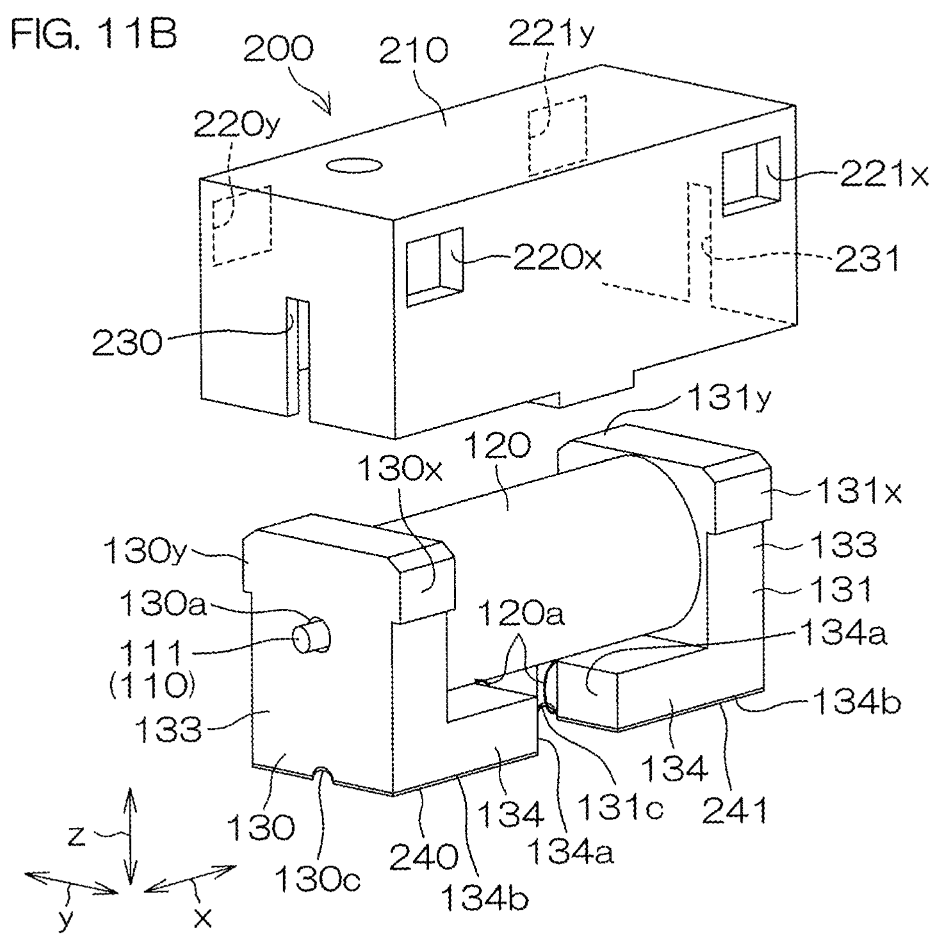
FIG. 11B is a partly exploded perspective view of the power generation sensor according to the second preferred embodiment.
Figure 11C:
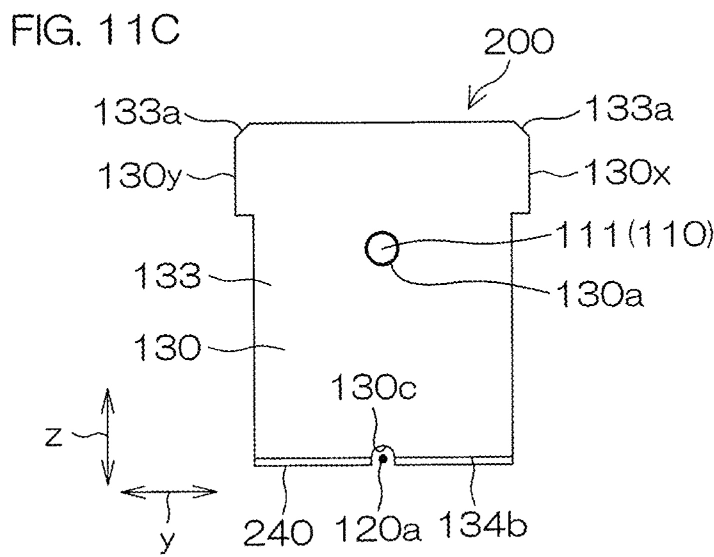
FIG. 11C is a side view of the power generation sensor according to the second preferred embodiment.

FIGS. 11A, 11B and 11C are a perspective view, a partly exploded perspective view and a side view, respectively, for describing the construction of a power generation sensor 200 according to a second preferred embodiment. In the description of the second preferred embodiment, components corresponding to those of the first preferred embodiment will be denoted by the same reference characters as in the first preferred embodiment.

In the power generation sensor 200 according to the second preferred embodiment, external terminal electrodes 240, 241 that permit surface-mounting are provided directly on the magnetic flux conducting pieces 130, 131 of the magnetically-soft components.

Specifically, the external terminal electrodes 240, 241 are respectively provided on surfaces of the magnetic flux conducting pieces 130, 131 opposed to the magnetic field source. More specifically, the external terminal electrodes 240, 241 are respectively provided on the detection region opposition surfaces 134*b* of the axis-parallel portions 134, i.e., surfaces of the axis-parallel portions 134 opposite from the magnetic wire 110. The external terminal electrodes 240, 241 each include, for example, a plating layer or an electrically conductive paste, and a solder layer. In this preferred embodiment, the external terminal electrodes 240, 241 respectively entirely cover the detection region opposition surfaces 134*b* of the axis-parallel portions 134. However, the external terminal electrodes 240, 241 may respectively partly cover the detection region opposition surfaces 134*b* of the axis-parallel portions 134.

The power generation sensor 200 according to this preferred embodiment further includes a case 210 in which the magnetic wire 110, the coil 120 and the magnetic flux conducting pieces 130, 131 are accommodated. The case 210 has a box shape having an opening on the side of the detection region opposition surfaces 134*b* of the magnetic flux conducting pieces 130, 131, and is configured so as to accommodate the magnetic wire 110, the coil 120 and the magnetic flux conducting pieces 130, 131 with the detection region opposition surfaces 134*b* of the magnetic flux conducting pieces 130, 131 exposed therefrom. As described above, the magnetic wire 110 is fixed to the magnetic flux conducting pieces 130, 131. Specifically, the opposite end portions 111, 112 of the magnetic wire 110 are respectively fixed to the wire placement portions 130*a*, 131*a* provided in the form of holes or grooves extending through the axis-orthogonal portions 133 of the magnetic flux conducting pieces 130, 131 by a resin. The magnetic flux conducting pieces 130, 131 and the coil 120 are fixed to the case 210, for example, by an adhesive resin and/or by fitting. Thus, the power generation sensor 200 can be provided, which has a complete construction unified with the case 210.

The partly exploded perspective view of FIG. 11B shows a state observed before the case 210 is fitted, and the side view of FIG. 11C shows a state with the case 210 removed as seen in the axial direction x from the side of the magnetic flux conducting piece 130. In this preferred embodiment, the substantially rectangular parallelepiped axis-orthogonal portions 133 each have projections 130*x*, 130*y*; 131*x*, 131*y* respectively provided on opposite ends thereof with respect to the width direction y that is orthogonal to the axial direction x and parallel to the detection region opposition surfaces 134*b* as projecting in the width direction y. In the illustrated example, these projections 130*x*, 130*y*; 131*x*, 131*y* are located on a side of the magnetic wire 110 opposite from the detection region opposition surfaces 134*b*. The end surfaces of the axis-orthogonal portions 133 opposite from the detection region opposition surfaces 134*b* each have chamfers 133*a* (e.g., round chamfers) formed on the opposite edges thereof with respect to the width direction y. The chamfers 133*a* function as guide portions that ensure smooth insertion in the case 210.

The case 210 is formed with holes 220*x*, 220*y*; 221*x*, 221*y* in which the projections 130*x*, 130*y*; 131*x*, 131*y* of the magnetic flux conducting pieces 130, 131 are respectively fitted. Further, the case 210 is formed with slits 230, 231 so as to prevent the opposite end portions of the magnetic wire 110 from contacting the case 210 when the assembly of the magnetic wire 110 is combined with the case 210. The slits 230, 231 extend in the direction z orthogonal to the detection region opposition surfaces 134*b*. The opposite end portions of the magnetic wire 110 are respectively inserted into the slits 230, 231 in this direction Z, whereby the assembly of the magnetic wire 110 is combined with the case 210.

As best shown in FIG. 11C which is the side view as seen in the axial direction x, the detection region opposition surfaces 134*b* of the magnetic flux conducting pieces 130, 131 are respectively formed with grooves 130*c*, 131*c* in which terminal wires 120*a* are passed for electrical contact with the coil 120. The terminal wires 120*a* are respectively connected to the external terminal electrodes 240, 241 in the grooves 130*c*, 131*c* by solder layers. In a production process, for example, it is preferred to place the terminal wires 120*a* in the grooves 130*c*, 131*c*, and then form the external terminal electrodes 240, 241 on the detection region opposition surfaces 134*b*. As shown in FIG. 11B, the grooves 130*c*, 131*c* may each continuously extend to the adjacent end 134*a* of the axis-parallel portion 134.

Figure 12A:
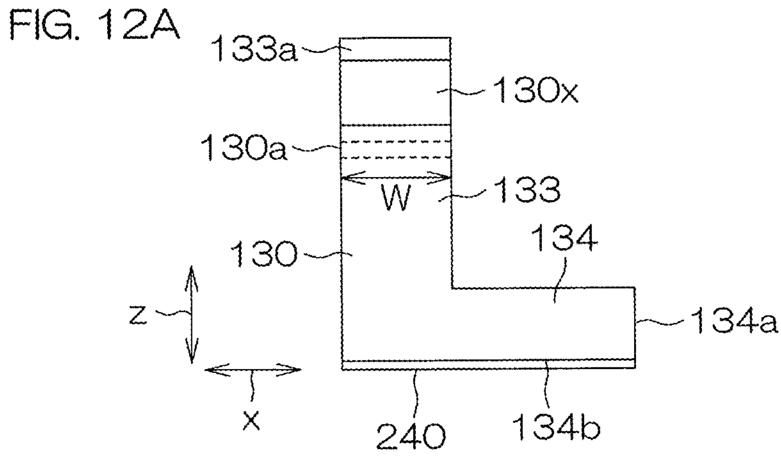
FIGS. 12A and 12B are front views showing examples of the structure of a magnetic flux conducting piece.
Figure 12B:
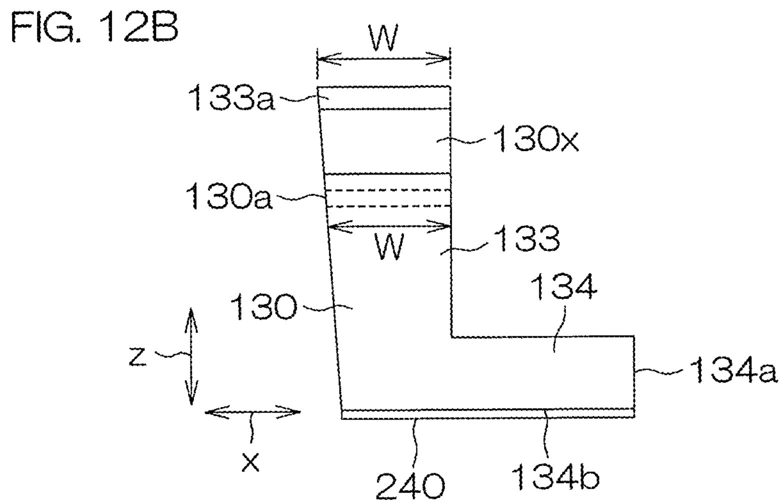

FIGS. 12A and 12B are front views of the magnetic flux conducting piece 130 as seen in the width direction y that is orthogonal to the axial direction x and parallel to the detection region opposition surface 134*b*. FIG. 12A shows an example in which the axis-orthogonal portion 133 has a uniform thickness W as measured in the axial direction x. That is, the thickness W of the axis-orthogonal portion 133 as measured in the axial direction x is substantially the same on the side of the detection region opposition surface and on the side opposite from the detection region opposition surface, and the thickness W is uniform in a region between these sides. Therefore, the axis-orthogonal portion 133 has a straight shape along the orthogonal direction z. In an example shown in FIG. 12B, on the other hand, the thickness W of the axis-orthogonal portion 133 as measured in the axial direction x is not uniform. That is, in this example, the thickness W of the axis-orthogonal portion 133 as measured in the axial direction x is smaller on the side of the detection region opposition surface 134*b*, and greater on the side opposite from the detection region opposition surface 134*b*. The thickness W is linearly changed in the region between these sides. Therefore, the axis-orthogonal portion 133 has a taper shape as seen from the front side, tapering in the orthogonal direction z toward the detection region opposition surface 134*b*. That is, the axis-orthogonal portion 133 has two nonparallel flat surfaces crossing the axial direction x. The tapered axis-orthogonal portion 133 functions to prevent the assembly from falling out of the case 210.

Figure 12C:
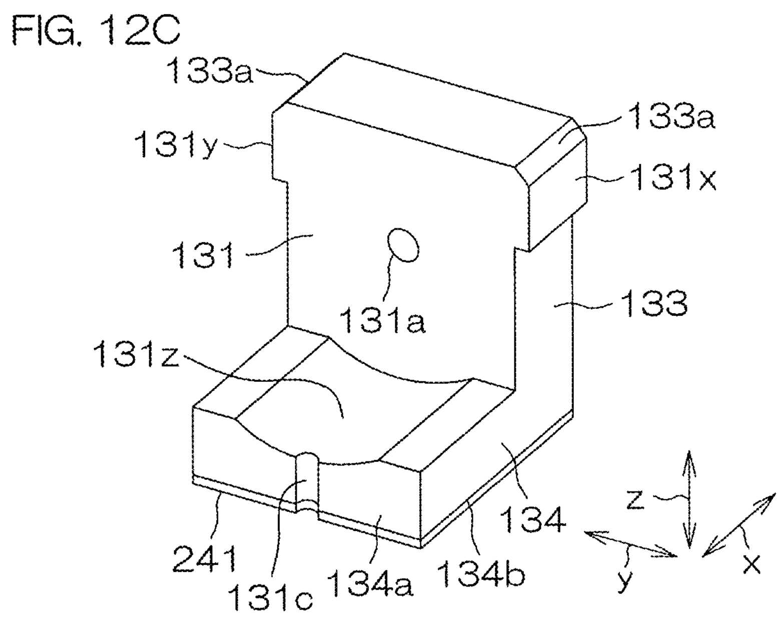
FIG. 12C is a perspective view showing the structure of a modification of the magnetic flux conducting piece.

FIG. 12C is a perspective view showing the structure of a modification of the magnetic flux conducting piece 131. The axis-parallel portion 134 of the magnetic flux conducting piece 131 has a surface 131*z* curved along the outer circumference of the hollow cylindrical coil 120 and opposed to the hollow cylindrical coil 120 (on a side opposite from the detection region opposition surface 134*b*). The surface 131*z* may be a part of a round cylindrical surface or an oval cylindrical surface conforming to the hollow cylindrical shape of the coil 120. With this arrangement, the coil 120 can be positioned and/or retained by the magnetic flux conducting piece 131. This improves the retention stability of the coil 120.

Even with the provision of the projections and the inclined surfaces or the curved surfaces on the magnetic flux conducting pieces 130, 131, the magnetic flux conducting pieces 130, 131 are not deteriorated in the function of correcting the alternating magnetic field generated in the detection region 140 into the axial magnetic field extending in the axial direction x of the magnetic wire 110. In other words, the axis-orthogonal portions 133 and the axis-parallel portions 134 are not necessarily required to each have a strict rectangular parallelepiped shape, but may each have a substantial rectangular parallelepiped shape as long as the magnetic field correcting function of the magnetic flux conducting pieces 130, 131 is not impaired. The axis-orthogonal portions 133 and the axis-parallel portions 134 preferably each have the substantial rectangular parallelepiped shape, but may each have some other shape that ensures the magnetic field correcting function described above.

Modification of Second Preferred Embodiment

Figure 13A:
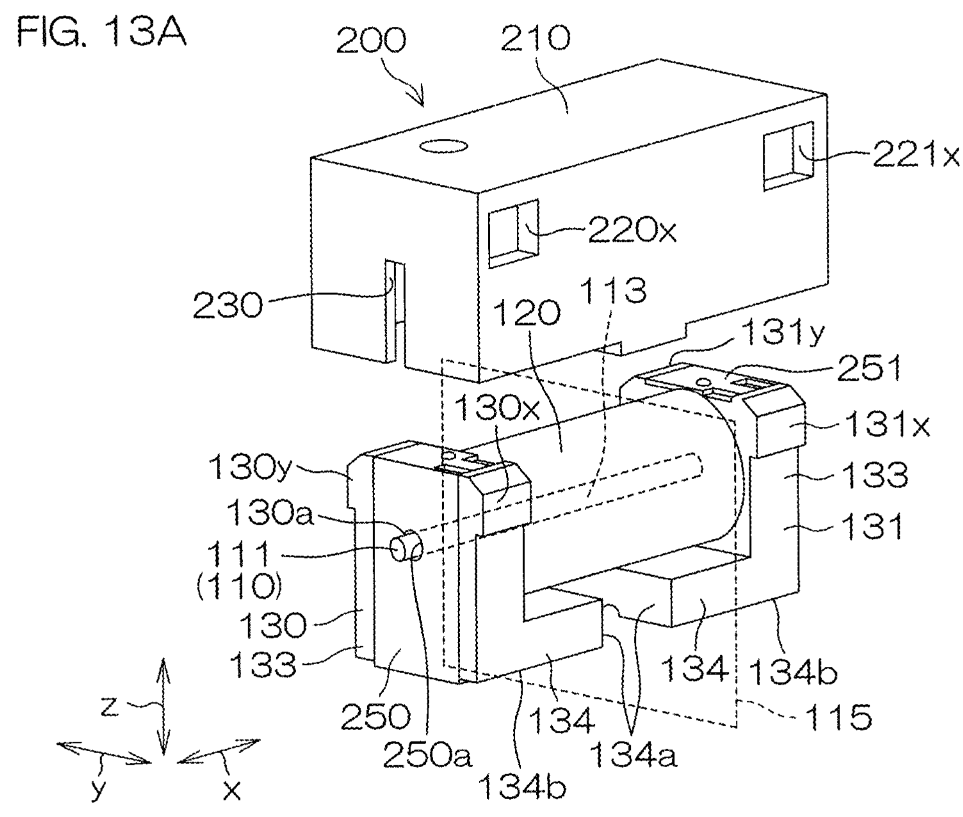
FIG. 13A is a perspective view showing the structure of a power generation sensor according to a modification of the second preferred embodiment.
Figure 13B:
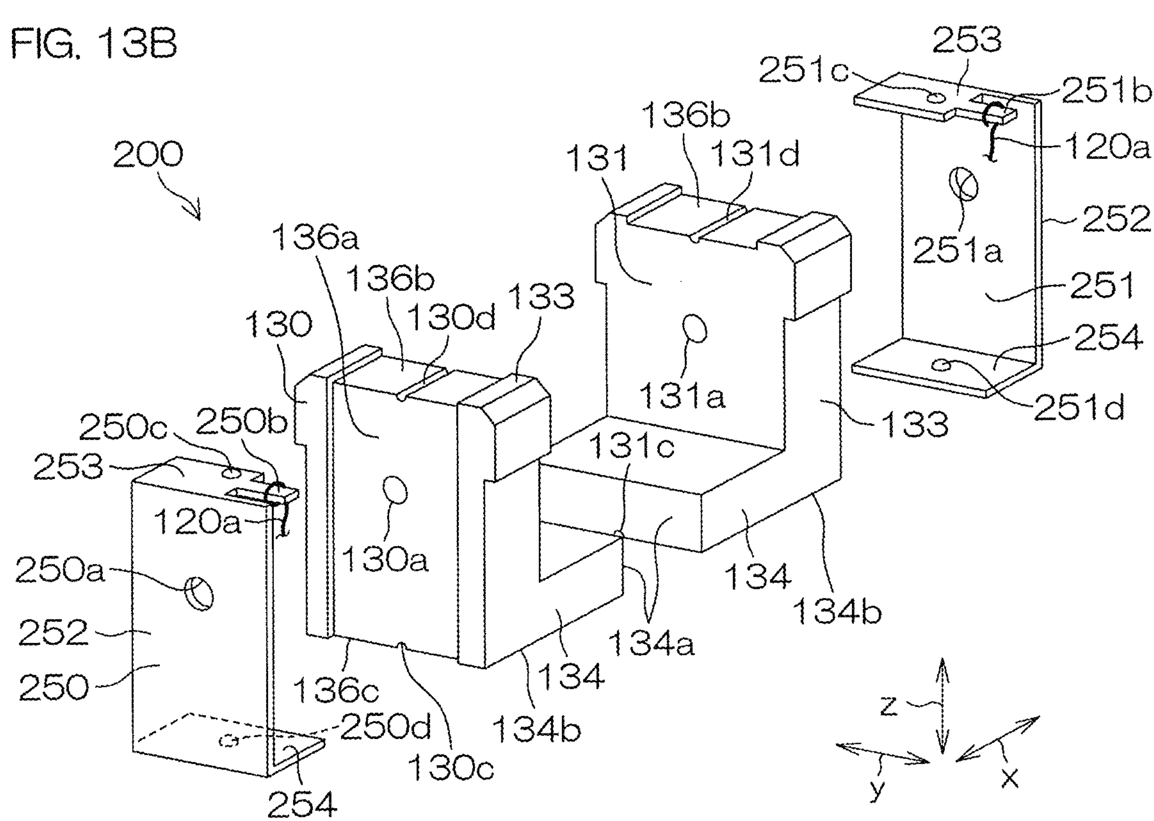
FIG. 13B is an exploded perspective view showing the structure of the power generation sensor according to the modification of the second preferred embodiment.

FIGS. 13A and 13B are diagrams for describing the structure of a power generation sensor 200 according to a modification of the second preferred embodiment. In this modification, the external terminal electrodes are provided in the form of lead frames. FIG. 13A is a perspective view of the power generation sensor 200 of lead frame type before the case 210 is fitted. The case has the same structure as shown in FIGS. 11A and 11B. FIG. 13B is an assembly diagram before lead frames 250, 251 are respectively fitted on the magnetic flux conducting pieces 130, 131. In FIG. 13B, however, the magnetic wire 110 and the coil 120 are not illustrated. Components corresponding to those shown in FIGS. 11A to 11C will be denoted by the same reference characters.

The lead frames 250, 251 are respectively formed so as to conform to the shapes of the magnetic flux conducting pieces 130, 131. More specifically, the lead frames 250, 251 are substantially symmetrical with respect to the symmetry plane 115 that is orthogonal to the axial direction x at the axially middle position 113 of the magnetic wire 110. The lead frames 250, 251 each include a side face portion 252 that extends along the outer side surface of the magnetic flux conducting piece 130, 131 orthogonally to the axial direction x, a top face portion 253 that extends inward in the axial direction x from one of opposite edges of the side face portion 252 along the top surface of the axis-orthogonal portion 133 (a surface opposite from the axis-parallel portion 134), and a bottom face portion 254 that extends inward in the axial direction x from the other edge of the side face portion 252 along the detection region opposition surface 134*b*, and is configured in a C-shape (in a sideway U-shape) inwardly open as seen from the front side. The magnetic flux conducting pieces 130, 131 are each formed with recesses 136*a*, 136*b*, 136*c* that accommodate the lead frame 250, 251. Specifically, the recess 136*a*, which accommodates the side face portion 252, is formed in the outer side surface of the axis-orthogonal portion 133. The recess 136*b*, which accommodates the top face portion 253, is formed in the top surface of the axis-orthogonal portion 133. The recess 136*c*, which accommodates the bottom face portion 254, is formed in the detection region opposition surface 134*b*. Thus, the lead frames 250, 251 are each disposed in contact with the bottom surfaces of the recesses 136*a*, 136*b*, 136*c* of the magnetic flux conducting piece 130, 131. The bottom face portion 254 of the lead frame 250, 251 is accommodated in the recess 136*c* to be flush with the detection region opposition surface 134*b* of the magnetic flux conducting piece 130, 131, whereby the flat surface for the surface mounting is provided on the side opposed to the magnetic field source, i.e., on the side of the detection region 140 (see FIG. 1B).

The side face portion 252 of the lead frame 250, 251 has a hole 250*a*, 251*a* through which the magnetic wire 110 extends. The top face portion 253 and the bottom face portion 254 of the lead frame 250, 251 are respectively formed with projections 250*c*, 250*d*; 251*c*, 251*d* projecting inward toward the magnetic flux conducting pieces 130, 131. These projections 250*c*, 250*d*; 251*c*, 251*d* may be each formed, for example, as a punch projection. The top surface of the axis-orthogonal portion 133 of the magnetic flux conducting piece 130, 131 has a groove 130*d*, 131*d* formed at a position corresponding to the projection 250*c*, 251*c* as extending in the axial direction x. Further, the projection 250*d*, 251*d* is provided at a position corresponding to the groove 130*c*, 131*c* formed in the detection region opposition surface 134*b* of the magnetic flux conducting piece 130, 131. The projections 250*c*, 250*d*; 251*c*, 251*d* are respectively fitted in the corresponding grooves 130*d*, 130*c*; 131*d*, 131*c* to facilitate the relative positioning of the lead frames 250, 251 with respect to the magnetic flux conducting pieces 130, 131, thereby improving the attachment ease when the lead frames 250, 251 are respectively attached to the magnetic flux conducting pieces 130, 131. The top face portions 253 of the lead frames 250, 251 are respectively provided with projections 250*b*, 251*b* for tangle-connection of the coil terminal wires 120*a*. Thus, the power generation sensor 200 can be surface-mounted on a printed wiring board or the like by electrically connecting the coil terminal wires 120*a* to the lead frames 250, 251 and combining the bottom face portions 254 of the lead frames 250, 251 to the board.

The external terminal electrodes are thus provided as the lead frames 250, 251 in direct contact with the magnetic flux conducting pieces 130, 131. This reduces the number of components of the power generation sensor 200. Thus, the power generation sensor 200 can be provided, which is of surface-mounting type having a simple and smaller-size structure.

Examples of Rotation Detection Device Employing Power Generation Sensor According to Second Preferred Embodiment FIGS. 14A and 14B are a perspective view and a plan view, respectively, showing a first exemplary arrangement of a rotation detection device employing the power generation sensor 200 according to the second preferred embodiment. This rotation detection device includes a ring magnet 440 as the magnetic field source, and the power generation sensor 200. The ring magnet 440 is connected to a rotation shaft 441 extending through the center thereof, and is rotatable together with the rotation shaft 441 about its axis. The ring magnet 440 is a hexapole magnet including three N-poles and three S-poles alternately circumferentially arranged in its pole surface orthogonal to the rotation shaft 441. A substrate 500 is disposed in opposed relation to the pole surface of the ring magnet 440, and the power generation sensor 200 is disposed on the substrate 500. The power generation sensor 200 is surface-mounted on the substrate 500, and the detection region opposition surfaces 134*b* of the magnetic flux conducting pieces 130, 131 are opposed to the pole surface of the ring magnet 440. More specifically, the power generation sensor 200 is disposed so that the magnetic wire 110 is positioned parallel to the tangential line 443 of a circle 442 corresponding to the rotation track of the ring magnet 440 and is opposed to the tangential line 443 in the axial direction of the rotation shaft 441. That is, the power generation sensor 200 is offset in the rotation radial direction from the rotation shaft 441, whereby the rotation detection device is of rotation shaft-through type. The power generation sensor 200 outputs six pulses for each turn of the rotation shaft 441.

FIGS. 15A and 15B are a perspective view and a plan view, respectively, showing a second exemplary arrangement of the rotation detection device employing the power generation sensor 200 according to the second preferred embodiment. In this exemplary arrangement, the power generation sensor 200 is centered on the center of the rotation shaft 441, and mounted on the substrate 500. In the hexapole ring magnet 440 including the S-poles and the N-poles circumferentially alternately arranged, magnetic poles of different polarities are opposed to the respective magnetic flux conducting pieces 130, 131. Thus, this arrangement can be achieved. This exemplary arrangement is not of the rotation shaft-through type, but is advantageous in that the device per se has a smaller size.

Figures 16A, 16B:
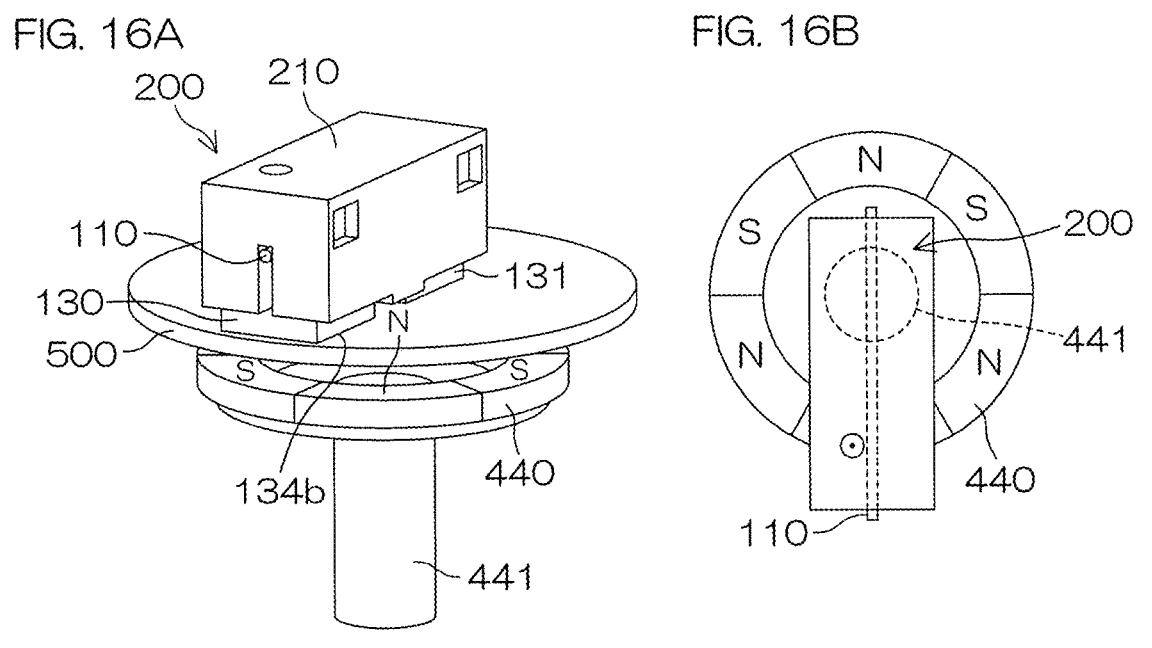

FIGS. 16A and 16B are a perspective view and a plan view, respectively, showing a third exemplary arrangement of the rotation detection device employing the power generation sensor 200 according to the second preferred embodiment. In this exemplary arrangement, the power generation sensor 200 (more specifically, the magnetic wire 110) is located at an intersection of the axis of the rotation shaft 441, but the center of the power generation sensor 200 (more specifically, the center of the magnetic wire 110) is offset from the rotation shaft 441 in the rotation radial direction. In this arrangement, one 130 of the magnetic flux conducting pieces 130, 131 is partly opposed to the rotation track of the pole surface of the ring magnet 440, and the other magnetic flux conducting piece 131 is not opposed to the rotation track of the pole surface of the ring magnet 440. Even with this arrangement, pulse signals outputted from the power generation sensor 200 are not significantly influenced, but are substantially comparable to those obtained by the second exemplary arrangement.

These first to third exemplary arrangements can be achieved by the magnetic field correcting function of the magnetic flux conducting pieces 130, 131 such that the alternating magnetic field generated in the detection region 140 is corrected into the axial magnetic field extending in the axial direction x of the magnetic wire 110, and the axial magnetic field is applied to the magnetic wire 110. In particular, where the ratio of the distance L between the adjacent ends 134*a* of the magnetic flux conducting pieces 130, 131 to the distance D between the magnetic wire positions of the pair of magnetic flux conducting pieces 130, 131 is properly set, the power generation sensor 200 is advantageous in that the layout of the power generation sensor 200 is more flexibly designed and, nevertheless, the output pulse signals are not significantly influenced. This makes it possible to employ various layouts of the power generation sensor including the layouts shown in the first to third exemplary arrangements. Thus, the power generation sensor 200 is capable of stably providing an output, and can be easily incorporated in rotation detection devices having various structures.

While the preferred embodiments of the present invention have thus been described, the invention may be embodied in some other ways.

In the preferred embodiments described above, for example, the pair of magnetic flux conducting pieces 130, 131 are arranged symmetrically with respect to the symmetry plane 115 defined at the axially middle position 113 of the magnetic wire 110. In this case, however, the symmetrical arrangement is not necessarily required to be symmetrical in a geometrically strict sense but may vary, as long as the magnetic field correcting function of the magnetic flux conducting pieces 130, 131 is not influenced.

In the foregoing description, the power generation sensor is used for the detection of the rotational position by way of example. Alternatively, the power generation sensor may be employed for a position detection device adapted to detect liner motion.

While the present invention has been described in detail by way of the preferred embodiments thereof, it should be understood that these preferred embodiments are merely illustrative of the technical principles of the present invention but not limitative of the invention. The scope of the present invention is to be limited only by the appended claims.

DESCRIPTION OF REFERENCE CHARACTERS

100: Power generation sensor
110: Magnetic wire
111: First end portion
112: Second end portion
113: Axially middle position
120: Coil
130: Magnetic flux conducting piece
130*a*: Wire placement portion
131: Magnetic flux conducting piece
131*a*: Wire placement portion
133: Axis-orthogonal portions
134: Axis-parallel portions
134*a*: Adjacent ends
134*b*: Detection region opposition surfaces
140: Detection region
200: Power generation sensor
240: External terminal electrode
241: External terminal electrode
250: Lead frame
251: Lead frame
400: Magnetic field source
410: Magnet
420: Magnet
430: Magnet
440: Ring magnet
D: Distance
L: Distance
W: Thickness
x: Axial direction
y: Width direction
z: Orthogonal direction

The invention claimed is:

1. A power generation sensor comprising:
a magnetic wire configured to exhibit a large Barkhausen effect by an alternating magnetic field applied in an axial direction thereof;
a coil wound around the magnetic wire; and
a pair of magnetic flux conducting pieces that include a pair of magnetically-soft components respectively magnetically coupled to opposite end portions of the magnetic wire and are symmetrical with each other with respect to a symmetry plane defined at an axially middle position of the magnetic wire;
wherein the pair of magnetic flux conducting pieces include: a pair of axis-orthogonal portions respectively fixed to the opposite end portions of the magnetic wire and respectively extending parallel to each other orthogonally to the axial direction from the opposite end portions of the magnetic wire; and a pair of axis-parallel portions extending toward each other in the axial direction from distal ends of the axis-orthogonal portions with their adjacent ends opposed to each other and spaced a gap from each other in the axial direction;
wherein a distance of the gap as measured in the axial direction is 5% to 50% of a distance between magnetic wire coupling positions of the axis-orthogonal portions as measured in the axial direction;
wherein the axis-orthogonal portions of the magnetic flux conducting pieces respectively have wire placement portions each formed with a hole or a groove extending therethrough in the axial direction;
wherein the magnetic wire extends through the wire placement portions of the axis-orthogonal portions and is fixed to the axis-orthogonal portions; and
wherein the power generation sensor is configured to have a detection region located on a side of the axis-parallel portions opposite from the magnetic wire.

2. The power generation sensor according to claim 1, wherein the pair of magnetic flux conducting pieces are configured such that a magnetic field generated in a space containing the pair of magnetic flux conducting pieces by a magnetic field source provided in the detection region is corrected into an axial magnetic field extending in the axial direction, and the axial magnetic field is applied to the magnetic wire.

3. The power generation sensor according to claim 1, wherein the distance of the gap as measured in the axial direction is 20% to 40% of the distance between the magnetic wire coupling positions of the pair of axis-orthogonal portions as measured in the axial direction.

4. The power generation sensor according to claim 1, wherein the axis-orthogonal portions each have a thickness that is 10% to 20% of an overall length of the magnetic wire as measured in the axial direction at the magnetic wire coupling position thereof.

5. The power generation sensor according to claim 1, wherein the magnetically-soft components are each formed of a material having a coercivity not higher than that of the magnetic wire and a relative magnetic permeability of not lower than 500.

6. The power generation sensor according to claim 1, further comprising surface-mounting external terminal electrodes respectively provided on the axis-parallel portions of the magnetic flux conducting pieces as facing the detection region.

7. A power generation sensor comprising:
a magnetic wire configured to exhibit a large Barkhausen effect by an alternating magnetic field applied in an axial direction thereof;
a coil wound around the magnetic wire; and
a pair of magnetic flux conducting pieces that include a pair of magnetically-soft components respectively magnetically coupled to opposite end portions of the magnetic wire and are symmetrical with each other with respect to a symmetry plane defined at an axially middle position of the magnetic wire;
wherein the pair of magnetic flux conducting pieces include: a pair of axis-orthogonal portions respectively fixed to the opposite end portions of the magnetic wire and respectively extending parallel to each other orthogonally to the axial direction from the opposite end portions of the magnetic wire; and a pair of axis-parallel portions extending toward each other in the axial direction from distal ends of the axis-orthogonal portions with their adjacent ends opposed to each other and spaced a gap from each other in the axial direction;

wherein a distance of the gap as measured in the axial direction is 5% to 50% of a distance between magnetic wire coupling positions of the axis-orthogonal portions as measured in the axial direction;

wherein the power generation sensor is configured to have a detection region located on a side of the axis-parallel portions opposite from the magnetic wire; and wherein the power generation sensor further includes surface-mounting external terminal electrodes respectively provided on the axis-parallel portions of the magnetic flux conducting pieces as facing the detection region.

* * * * *